US011562803B2

(12) United States Patent
Hwang et al.

(10) Patent No.: US 11,562,803 B2
(45) Date of Patent: Jan. 24, 2023

(54) MEMORY DEVICE STORING PARITY AND MEMORY SYSTEM INCLUDING THE SAME

(71) Applicant: Samsung Electronics Co., Ltd., Suwon-si (KR)

(72) Inventors: Youngjun Hwang, Hwaseong-si (KR); Heeyoul Kwak, Namyangju-si (KR); Bohwan Jun, Seoul (KR); Hongrak Son, Anyang-si (KR); Dongmin Shin, Seoul (KR); Geunyeong Yu, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/244,195

(22) Filed: Apr. 29, 2021

(65) Prior Publication Data

US 2022/0130485 A1 Apr. 28, 2022

(30) Foreign Application Priority Data

Oct. 23, 2020 (KR) .......................... 10-2020-0138599

(51) Int. Cl.
*G11C 16/10* (2006.01)
*G11C 29/42* (2006.01)
(Continued)

(52) U.S. Cl.
CPC ............ *G11C 29/42* (2013.01); *G11C 16/102* (2013.01); *G11C 16/26* (2013.01); *G11C 29/44* (2013.01); *G11C 29/78* (2013.01)

(58) Field of Classification Search
CPC ....... G11C 29/42; G11C 16/102; G11C 16/26; G11C 29/44; G11C 29/78; G06F 11/1048; G06F 11/1068; G06F 11/1044
See application file for complete search history.

(56) References Cited

U.S. PATENT DOCUMENTS 8,239,730 B2 8/2012 Uchikawa et al.
8,375,272 B2 2/2013 Litsyn et al.
(Continued)

FOREIGN PATENT DOCUMENTS

KR 10-2014-0060285 A 5/2014
KR 10-1711056 2/2017

OTHER PUBLICATIONS

Extended European Search Report dated Dec. 13, 2021 issued in corresponding European Patent Application No. 21180131.1.

*Primary Examiner* — Xiaochun L Chen
(74) *Attorney, Agent, or Firm* — Harness, Dickey & Pierce, P.L.C.

(57) ABSTRACT

A memory device includes a cell array including a plurality of pages and a control logic configured to control program and read operations of the cell array. The control logic controls the program and read operations to store first through N-th codewords in a first page among the pages and program a page parity corresponding in common to the first through N-th codewords to the first page in response to a program command for a page unit and to selectively read the first codeword among the first through N-th codewords in response to a read command for a sub-page unit, where N is an integer of at least 2. The first codeword includes first sub-page data and a first sub-parity corresponding thereto, and the first sub-parity includes information for correcting an error in the first sub-page data through error correction code (ECC) decoding independently performed on each codeword.

19 Claims, 26 Drawing Sheets

(51) Int. Cl.
    *G11C 16/26*     (2006.01)
    *G11C 29/44*     (2006.01)
    *G11C 29/00*     (2006.01)

(56) References Cited

U.S. PATENT DOCUMENTS

| | | |
|---|---|---|
| 8,874,994 B2 | 10/2014 | Sharon et al. |
| 8,977,937 B2 | 3/2015 | Zhang et al. |
| 9,183,085 B1 | 11/2015 | Northcott |
| 9,984,771 B2 | 5/2018 | Bonke |
| 10,498,367 B2 | 12/2019 | Parthasarathy et al. |
| 2007/0192530 A1* | 8/2007 | Pedersen ............ G06F 12/0246 |
| | | 711/E12.008 |
| 2014/0245098 A1 | 8/2014 | Sharon et al. |
| 2016/0378595 A1 | 12/2016 | Rho et al. |

\* cited by examiner

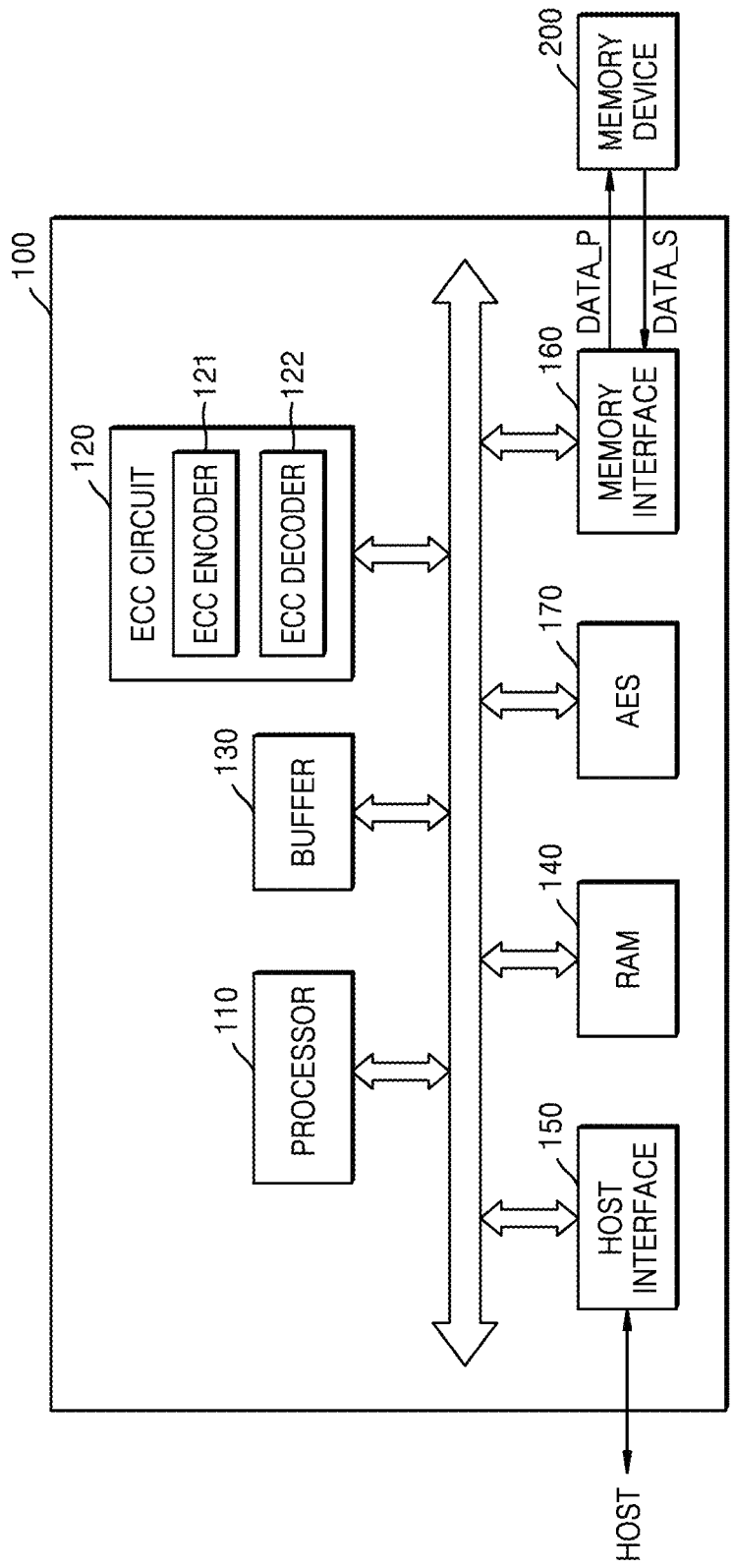

FIG. 9

| DATA_S1 | PAR_S1 | DATA_S2 | PAR_S2 | DATA_S3 | PAR_S3 | DATA_S4 | PAR_S4 | PAR_P |

FIRST PAGE

SECOND PAGE

THIRD PAGE

FOURTH PAGE

FIG. 10

| DATA_S1 | PAR_S1 | FIRST PAGE |
| DATA_S2 | PAR_S2 | SECOND PAGE |
| DATA_S3 | PAR_S3 | THIRD PAGE |
| DATA_S4 | PAR_S4 | PAR_P | FOURTH PAGE |

FIG. 15A

| Decoding Failure Sub-Page | | | All-Zero |
| --- | --- | --- | --- |
| Sub H matrix (FIRST SUB-PAGE) | Sub H matrix (SECOND SUB-PAGE) | Sub H matrix (THIRD SUB-PAGE) | Sub H matrix (FOURTH SUB-PAGE) |
| | Error-Free | Error-Free | Decoding Failure Sub-Page |
| | H matrix covering 4 sub-matrices (Page) | | |

MEMORY DEVICE STORING PARITY AND MEMORY SYSTEM INCLUDING THE SAME

CROSS-REFERENCE TO RELATED APPLICATION

This application is based on and claims priority under 35 U.S.C. § 119 to Korean Patent Application No. 10-2020-0138599, filed on Oct. 23, 2020, in the Korean Intellectual Property Office, the disclosure of which is incorporated by reference herein in its entirety.

BACKGROUND

Inventive concepts relate to a memory device, and more particularly, to a memory device storing a parity related to error correction and/or a memory system including the same.

As memory devices, non-volatile memory devices include a plurality of memory cells storing data in a non-volatile memory. As an example of a non-volatile memory device, a flash memory device may be used in at least one of a cellular phone, a digital camera, a personal digital assistant (PDA), a mobile computing system, a stationary computing system, and other devices.

With the development of semiconductor manufacturing technology, the high integration density and high capacity of memory devices continue to be in progress. As the scale of storage devices decreases with the high integration density of memory devices, an error rate of data stored in memory devices is increasing. An error correction code (ECC) method is used for data error correction, but space storing a parity to increase error performance and/or a time taken for error correction increases.

SUMMARY

Inventive concepts provide a memory device for enhancing error correction capability and quickly performing a read operation corresponding to a read request from a host and/or a memory system including the same.

According to some example embodiments of inventive concepts, there is provided a memory device including a cell array including a plurality of pages, and a control logic circuitry configured to control program operations of the cell array and read operations of the cell array. The control logic circuitry is configured to control the program operations and read operations such that in response to a program command for a page, the memory device stores first through N-th codewords in a first page among the plurality of pages and the memory device programs a page parity corresponding in common to the first through N-th codewords to the first page, and in response to a read command for a sub-page, the memory device selectively reads the first codeword among the first through N-th codewords, where N is an integer of at least 2. The first codeword includes first sub-page data and a first sub-parity corresponding to the first sub-page data, and the first sub-parity includes information associated with correcting an error in the first sub-page data through error correction code (ECC) decoding, the ECC decoding independently performable on each of the first through N-th codewords.

According to some example embodiments of inventive concepts, there is provided a memory system including a memory device including a cell array including a plurality of pages, and a memory controller circuitry including a memory interface circuitry configured to communicate with the memory device, and an error correction code (ECC) circuitry configured to generate a codeword including a sub-parity by performing first ECC encoding on sub-page data and to generate a page parity by performing second ECC encoding on first through N-th codewords generated through the first ECC encoding, In response to a write request from a host the memory controller circuitry is configured to transmit a program command associated with a page to the memory device and to program the first through N-th codewords and the page parity to a first page of the cell array, and in response to a read request from the host, the memory controller circuitry is configured to transmit a read command associated with a sub-page to the memory device and to selectively read the first codeword, where N is an integer of at least 2.

According to some example embodiments of inventive concepts, there is provided a method including receiving, from a host, a plurality of write requests and a plurality of pieces of write data respectively corresponding to the plurality of write requests, generating a codeword by performing first error correction code (ECC) encoding in units of sub-pages, the sub-pages including at least one piece of write data, generating a page parity by performing ECC encoding based on first through N-th codewords generated through the first ECC encoding, where N is an integer of at least 2, programming the first through N-th codewords and the page parity to a first page of a memory device in a program operation, the program operation performed in pages, and selectively reading the first codeword from the first page in response to a read request of the host. The first codeword includes first sub-page data and a first sub-parity corresponding to the first sub-page data, and error correction is performed on the first sub-page data through ECC decoding, the ECC decoding independently performed on each codeword.

BRIEF DESCRIPTION OF THE DRAWINGS

Some example embodiments of inventive concepts will be more clearly understood from the following detailed description taken in conjunction with the accompanying drawings in which:

FIG. 2 is a block diagram illustrating an implementation of a memory controller in FIG. 1;

FIGS. 9 and 10 are respectively diagrams or examples of a program operation performed in units of pages, according to some example embodiments;

FIGS. 15A and 15B are respectively diagrams illustrating implementations of a parity based on low density parity code (LDPC), according to some example embodiments;

DETAILED DESCRIPTION OF SOME EXAMPLE EMBODIMENTS

Hereinafter, some example embodiments will be described in detail with reference to the accompanying drawings.

Figure 1:
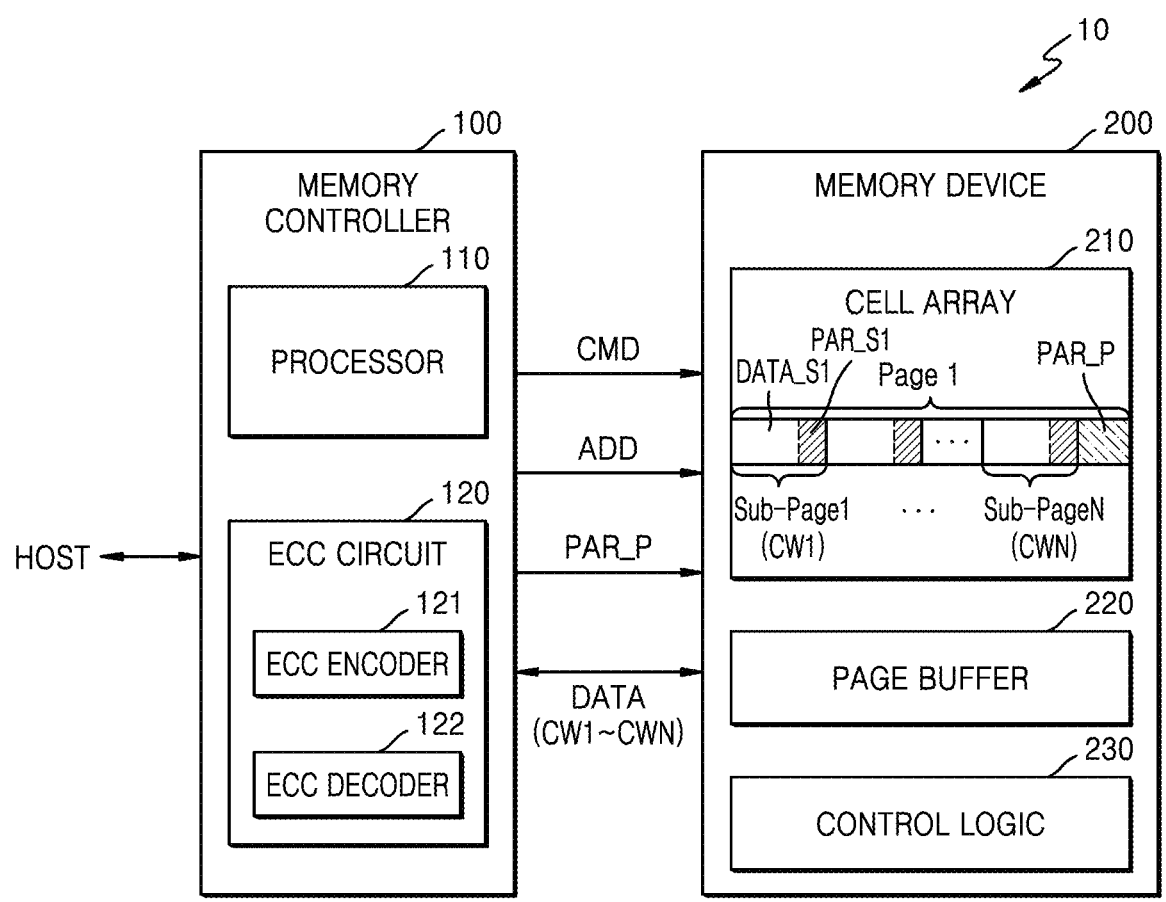
FIG. 1 is a block diagram of a memory system according to some example embodiments.

FIG. 1 is a block diagram of a memory system 10 according to some example embodiments. Referring to FIG. 1, the memory system 10 may include a memory controller 100 and a memory device 200. The memory device 200 may include a memory cell array 210, a page buffer 220, and a control logic 230. The memory controller 100 may include a processor 110 and an error correction code (ECC) circuit 120; or, alternatively, the memory controller 100 may include a processor 110 that further performs the functions of the ECC circuit 120. The ECC circuit 120 may include an ECC encoder 121 and an ECC decoder 122; or, alternatively, the processor 110 may perform the functions described with reference to the ECC encoder 121 and the ECC decoder 122.

According to some example embodiments, the memory device 200 may include a non-volatile memory device. For example, the memory device 200 may include a non-volatile memory device such as at least one of NAND flash memory, vertical NAND (VNAND) flash memory, NOR flash memory, resistive random access memory (RRAM), phase-change memory, or magnetoresistive RAM (MRAM) In some example embodiments, the memory device 200 or the memory system 10 may be implemented as an embedded memory of an electronic device and/or an external memory that may be removed from an electronic device. For example, the memory device 200 or the memory system 10 may be implemented in various forms such as at least one of a an embedded universal flash storage (UFS), an embedded multi-media card (eMMC), a solid state drive (SSD), a UFS memory card, a compact flash (CF) card, a secure digital (SD) card, a micro-SD card, a mini-SD card, and an extreme digital (xD) card.

The memory controller 100 may control the memory device 200 to read data stored therein and/or to write (or program and/or erase) data thereto in response to a read or write request from a host. In detail, the memory controller 100 may control the program, read, and erase operations of the memory device 200 by providing an address ADD and a command CMD to the memory device 200. Data DATA to be written to the memory device 200 and data DATA read from the memory device 200 may be exchanged between the memory controller 100 and the memory device 200.

The memory cell array 210 may include a plurality of cell blocks. Each of the cell blocks may include, e.g. be divided into, a plurality of pages. Each of the pages may include a plurality of memory cells. In the memory cell array 210, a data erase operation may performed in units of cell blocks, and a data program operation and a data read operation may be performed in units of at least part of a page. According to some example embodiments, the memory device 200 may perform a program operation and/or a read operation in units having different sizes. In some example embodiments, a page may include a plurality of sub-pages, and the memory device 200 may perform a program operation in units of pages and a read operation in units of sub-pages. A size (e.g. a number of bits) of each page may be the same. A size (e.g. a number of bits) of each of the sub-pages included in one page may be the same, or may be different from one another.

The processor 110 may generally control operations of the memory controller 100. For example, the processor 110 may control internal operations of the memory controller 100 and/or various operations related to data erasing, programming, and reading by executing instructions stored in the memory controller 100. The ECC encoding operation and ECC decoding operation of the ECC circuit 120 may be controlled based on the control of the processor 110. According to some example embodiments, a control operation may be performed based on the control of the processor 110 such that a data program operation and a data read operation are performed in units having different sizes, e.g. a different number of bits.

The memory controller 100 may be requested by the host to access data in certain units, for example, in units having a size smaller than (less than) the size of a page. For example, assuming that the size of a page is 16 KB and the size of a sub-page is 4 KB in the memory cell array 210, each page may include (or be divided into) four sub-pages, and access requested by the host may be provided in units that correspond to a size that is less than or equal to 4 KB. According to some example embodiments, the host may request to access data in 512 B units, and the memory controller 100 may perform a program operation in units of pages including a plurality of pieces of write data. When a read request is received from the host, a read operation may be selectively performed on data of a sub-page including requested data among a plurality of sub-pages.

According to some example embodiments, the ECC encoder 121 may perform ECC encoding on data of a sub-page unit (hereinafter, referred to as sub-page data) and thus generate a sub-page parity (hereinafter, referred to as a sub-parity) corresponding to the sub-page data. The sub-page parity may be or may correspond to the evenness or the oddness of the bits included in the sub-page. Information, which includes sub-page data and a sub-parity corresponding to the sub-page data, may be referred to as a codeword. The ECC encoder 121 may generate a common parity corresponding to at least two pieces of sub-page data, for example, a common parity (hereinafter, referred to as a page parity PAR_P) corresponding to all sub-page data included in a single page. The memory controller 100 may perform a program operation on each page, which includes the codeword described above and the page parity PAR_P.

In some example embodiments, various terms may be variously defined. For example, a concept covering sub-page data and a sub-parity corresponding to the sub-page data may be referred to as a codeword or a sub codeword but is referred to as a codeword below for convenience of description. In the description of some example embodiments, a codeword may interchangeably be used with sub-page data. For example, reading of sub-page data may refer to reading of a codeword, and storing of sub-page data in a sub-page may refer to storing of a codeword in the sub-page. The page parity PAR_P may be generated using at least partial information in each codeword. The page parity PAR_P may be generated from a plurality of pieces of sub-page data or a plurality of codewords. When a page includes N sub-pages, it is assumed that a single codeword is stored in each sub-page and N codewords and the page parity PAR_P corresponding to the N codewords are stored in the page.

The ECC decoder 122 may perform ECC decoding on data read from the memory device 200. For example, The ECC decoder 122 may receive a codeword read from each sub-page and correct an error in sub-page data by performing ECC decoding using a sub-parity. For example, the ECC decoder 122 may correct an error in sub-page data by independently performing ECC decoding on each codeword. When the ECC decoding of the codeword is successful, data may be output from the memory controller 100 to the host in a unit (e.g., a unit less than or equal to a sub-page) corresponding to a request of the host.

When error correction using a sub-parity fails, the ECC decoder 122 may receive the page parity PAR_P and the other codewords included in a page and perform ECC decoding on the page using the page parity PAR_P and the other codewords. For example, when there is an uncorrectable error in a piece of sub-page data (e.g., first sub-page data), the error in the first sub-page data may nonetheless be corrected by performing ECC decoding using the other sub-page data and the page parity PAR_P.

The memory cell array 210 may include a plurality of pages. For example, a first page Page1 may include first through N-th sub-pages Sub-Page1 through Sub-PageN, and first through N-th codewords CW1 through CWN may be respectively stored in the first through N-th sub-pages Sub-Page1 through Sub-PageN. Sub-page data and a sub-parity may be stored in each sub-page. For example, first sub-page data DATA_S1 and a first sub-parity PAR_S1 may be stored in the first sub-page Sub-Page1. The page parity PAR_P may also be stored in the first page Page1.

According to some example embodiments, data to be written and/or data that has been read may be stored in the page buffer 220 according to a program and/or read operation, and data of the page unit may be stored in the page buffer 220 and provided to the cell array 210. In a data read operation, data read in sub-page units may be stored in the page buffer 220. Sub-page data stored in the page buffer 220 is provided to the memory controller 100. According to some example embodiments described above, the memory controller 100 may perform ECC decoding on each sub-page and, when there is no error or an error has been corrected, may provide sub-page data to the host without additionally performing a read operation on the first page Page1.

When an error in sub-page data corresponding to a codeword (e.g., a first code word CW1) is not corrected, the second through N-th codewords CW2 through CWN of the first page Page1 and the page parity PAR_P may be read and stored in the page buffer 220, and then provided to the memory controller 100. The ECC decoder 122 may correct the error in the first sub-page data by performing ECC decoding using the page parity PAR_P and may provide error-corrected first sub-page data to the host.

The control logic 230 may generally control operations of memory device 200 in relation to a memory operation. For example, the control logic 230 may generate an internal control signal for an internal control operation of the memory device 200 based on a control signal (not shown) from the memory controller 100. According to some example embodiments, the control logic 230 may perform an internal control operation such that data is provided from the page buffer 220 to the memory cell array 210 in units of pages and is provided from the page buffer 220 to the memory controller 100 in units of sub-pages.

According to some example embodiments described above, error correction is performed based on a parity provided for each sub-page and a parity provided for each page, and accordingly, an error level of the memory system 10 may be improved and/or high data reliability may be achieved. Alternatively or additionally, because ECC decoding is independently performed on a page in units of sub-page data (or codewords), only a codeword including sub-page data requested by the host may be selectively read and undergo error correction.

For example, the greater the ECC processing unit size, the more errors may usually be corrected, but a time taken for the ECC processing increases and/or the resources of the memory system 10 are inefficiently used because data of a larger size than a read unit requested by the host is read and undergoes the ECC processing. However, according to some example embodiments, error correction capability may be enhanced, a time taken for processing a read request from the host may be decreased, and/or the resources of the memory system 10 may be efficiently used. Conventionally, when error correction cannot be performed in ECC units, a procedure for entering a read retry mode and correcting an error is performed, causing a read time to greatly increase. However, according to some example embodiments, an error may be corrected through ECC processing based on a page parity.

The ECC circuit 120 may perform various kinds of ECC encoding and decoding. For example, although low density parity-check code (LDPC) is used in some example embodiments, example embodiments are not limited thereto. For example, Bose-Chadhuri-Hocquenghem code, Reed Solomon code, and/or other various kinds of error correction algorithms may be used to generate a parity. According to some example embodiments, a sub-parity and the page parity PAR_P may be generated using the same error correction algorithm or different error correction algorithms. Although the ECC circuit 120 is included in the memory controller 100 in example embodiment of FIG. 1, example embodiments are not limited thereto. The memory system 10 may be implemented such that the ECC circuit 120 is included in the memory device 200. Alternatively, the memory device 200 may have some functions of the ECC circuit 120. For example, the memory device 200 may have an ECC function related to an ECC encoding/decoding operation or an ECC function related to a sub-page/page unit.

FIG. 2 is a block diagram illustrating an implementation of the memory controller 100 in FIG. 1.

Referring to FIGS. 1 and 2, the memory controller 100 may include the processor 110, the ECC circuit 120, a buffer 130, random access memory (RAM) 140, a host interface 150, a memory interface 160, and an advanced encryption standard (AES) 170. The processor 110 may be electrically connected to various elements of the memory controller 100 through a bus, such as a wired bus and/or a wireless bus, and may perform a control operation thereon.

The processor 110 may interpret a request received from the host and may control the memory system 10 to perform an operation according to an interpretation result. The processor 110 may perform a control operation such that data is accessed in different units in a program operation and a read operation. The processor 110 may perform a general control operation of the memory system 10 by executing instructions stored in the RAM 140 and/or using metadata stored in the RAM 140. For example, mapping information, which is used to translate a logical address into a physical address of the memory device 200, may be stored in the RAM 140. A program operation may be performed in page units and a read operation may be performed in sub-page units, using the mapping information.

Write data transmitted from the host or data read from the memory device 200 may be temporarily stored in the buffer 130. According to some example embodiments, when write data having a size that is less than or equal to a sub-page unit is provided from the host, a plurality of pieces of write data, which form a single page, may be stored in the buffer 130. An ECC encoding process may be performed in sub-page units and in page units, using the data stored in the buffer 130. When a data read request is received from the host, requested sub-page data may be stored in the buffer 130, ECC decoding may be performed on the sub-page data stored in the buffer 130, and ECC decoded sub-page data may be provided to the host.

The host interface 150 may communicate with the host according to a certain interface. The host interface 150 may include at least one of an advanced technology attachment (ATA) interface, a serial ATA (SATA) interface, a parallel ATA (PATA) interface, a universal serial bus (USB) interface, a small computer system interface (SCSI), a serial attached SCSI (SAS), an eMMC interface, or a Unix file system (UFS) interface, but these are just examples and embodiments are not limited thereto.

The memory interface 160 may be electrically connected to the memory device 200. For example, the memory interface 160 may be configured to support an interface with a NAND flash memory chip or a NOR flash memory chip. According to some example embodiments, the memory interface 160 may provide write data DATA_P to the memory device 200 in page units and receive read data DATA_S from the memory device 200 in sub-page units.

The ECC circuit 120 may perform the ECC encoding and/or decoding described above. For example, the ECC encoder 121 may generate a sub-parity and the page parity PAR_P based on data of the page unit stored in the buffer 130. The ECC decoder 122 may perform ECC decoding using the sub-parity based on data of the sub-page unit stored in the buffer 130. Error-corrected sub-page data may be provided to the host through the host interface 150.

The AES 170 may perform at least one selected from encryption and decryption on data input to the memory controller 100 using various kinds of encryption/decryption algorithms (e.g., a symmetric-key algorithm and/or an algorithm based on hashes such as cryptographically secure hashes).

Figure 3A:
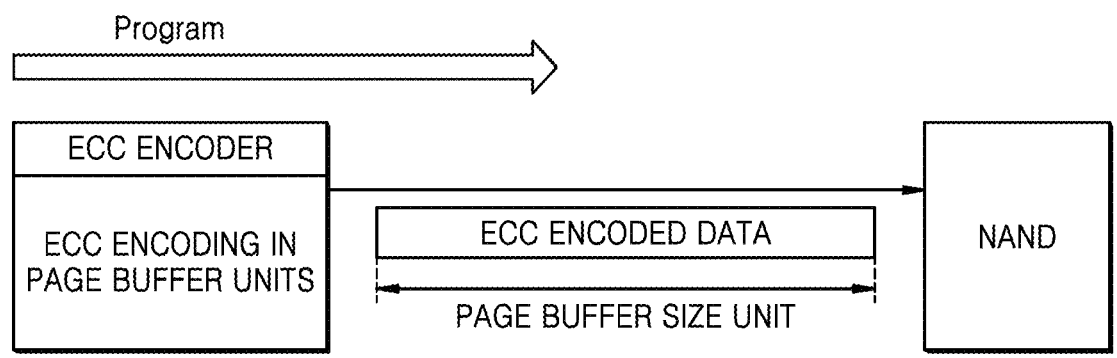
FIGS. 3A and 3B are respectively diagrams illustrating an example of a program operation and an example of a read operation, according to some example embodiments.
Figure 3B:
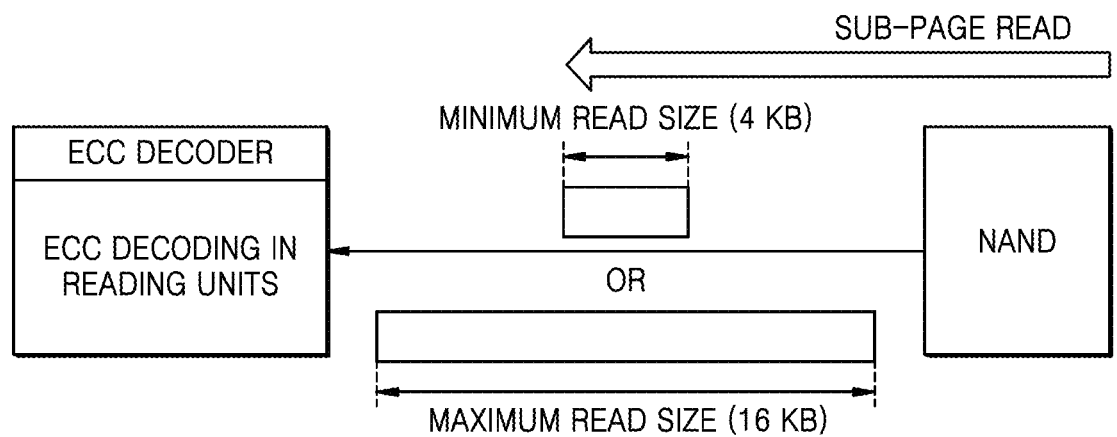

FIGS. 3A and 3B are respectively diagrams illustrating an example of a program operation and an example of a read operation, according to some example embodiments. FIGS. 3A and 3B show examples in which a page buffer has a certain size, e.g., 16 KB, and includes sub-pages of 4 KB, data programming is performed in page buffer size units and data reading is performed in various size units. A host may request a memory system to write and/or read data in various size units, for example, in units of a size corresponding to a multiple of 512 B.

Referring to FIG. 3A, an ECC encoder may perform ECC encoding in units of pages (e.g. in page buffer units). For example, the ECC encoder may generate the sub-parity described above with respect to sub-page data and may generate a page parity by performing ECC encoding on a plurality of pieces of sub-page data in page buffer units. ECC encoded data including the page parity may be provided to a memory device including a NAND or the like. For example, the ECC encoded data corresponding to a page buffer unit may include the page parity and codewords for four sub-pages.

A read operation on the NAND may be performed in units of at most 16 KB corresponding to the size of the page buffer. For example, data may be read from the NAND and provided to an ECC decoder in units of a sub-page corresponding to a size of 4 KB. The ECC decoder may receive a codeword, which includes sub-page data and a sub-parity, and perform ECC decoding on the codeword. Error corrected sub-page data may be provided to the host. When an error in the sub-page data is not corrected, a read operation may be performed on the NAND in greater size units. For example, a plurality of pieces of sub-page data and page data may be read in units of the remaining size of 12 KB, and ECC decoding may be performed in page units. According to various example embodiments, when an error in a piece of sub-page data is not corrected, 16-KB data including the sub-page data may be read, and ECC decoding may be performed in page units.

According to some example embodiments shown in FIGS. 3A and 3B, the memory system may receive, from the host, a request for writing data of a certain size (e.g., 512 B) multiple times, may generate a sub-parity and a page parity with respect to 16-KB data according to some example embodiments described above, and may program ECC encoded data to the NAND in page buffer units. The memory system may receive a request for reading 512-B data from the host; read sub-page data, which includes a position indicated by the host and corresponds to a unit of independent ECC decoding; perform ECC decoding in sub-page units, and then provide the sub-page data, which has no errors or has a corrected error, to the host.

When a parity for each page is provided according to example embodiments described above, error correction capability may be enhanced, and an error correction speed and a speed, at which read data is provided to the host, may be increased by independently performing ECC decoding on each sub-page in response to a read request of the host.

Although the size of the page buffer is 16 KB in some example embodiments of FIGS. 3A and 3B, the size of the page buffer may have a greater value (e.g., a multiple of 4 KB). In this case, a memory system may generate a page parity based on more pieces of write data from a host and perform a program operation in greater size units.

According to some example embodiments, when a read request is received from a host, a memory device may read data in page buffer units and may provide a memory controller with data of the sub-page unit corresponding to a read request of the host, among data of the page unit stored in the page buffer. For example, the memory device may read and store data in the page buffer in page units, and may provide the data to the memory controller in sub-page units. When the memory device receives information, which indicates that an error has not been corrected, from the memory controller, the memory device may provide the remaining data in the page buffer to the memory controller.

Figure 4:
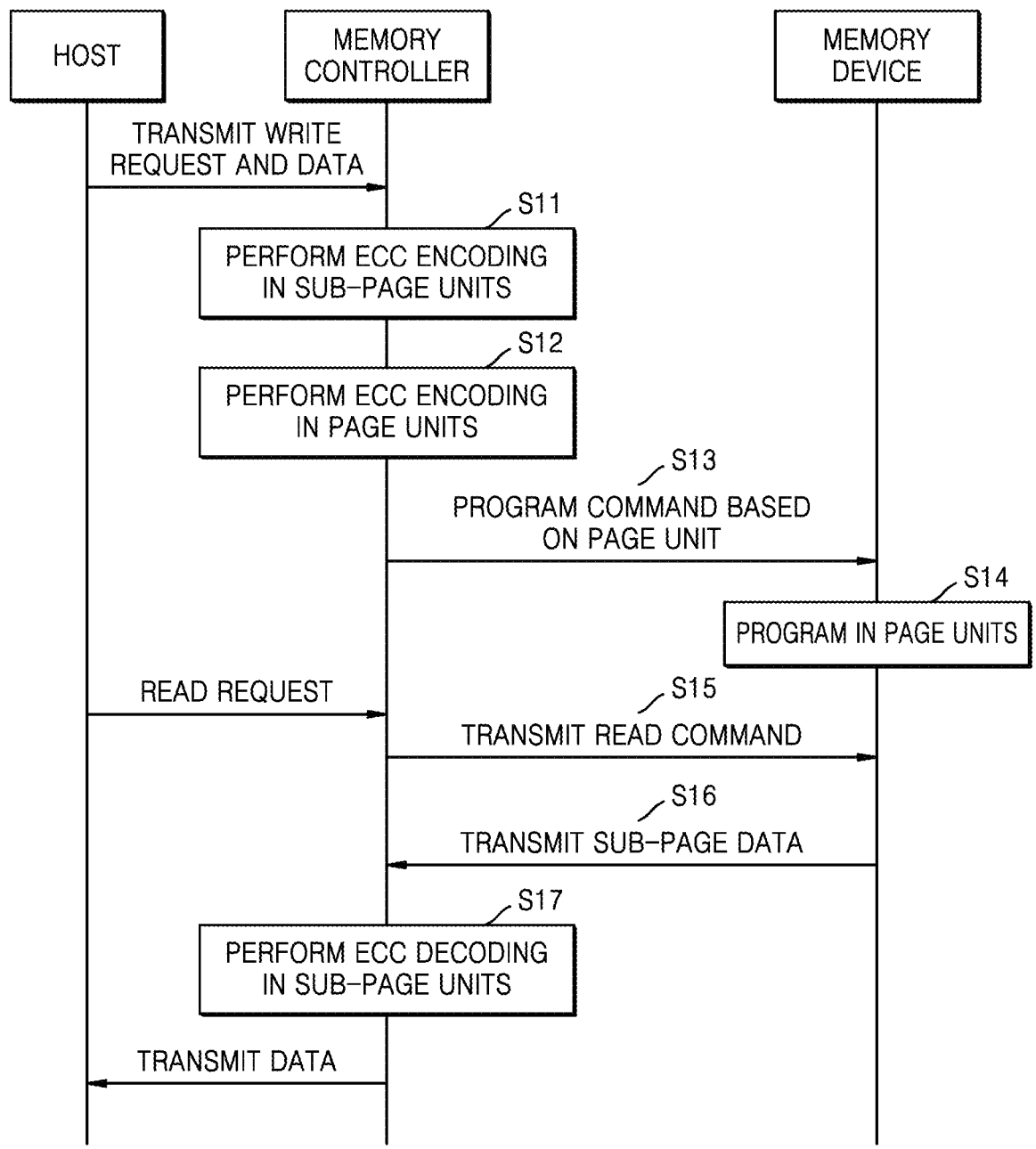
FIGS. 4 and 5 are flowcharts of an operation method of a memory system, according to some example embodiments.
Figure 5:
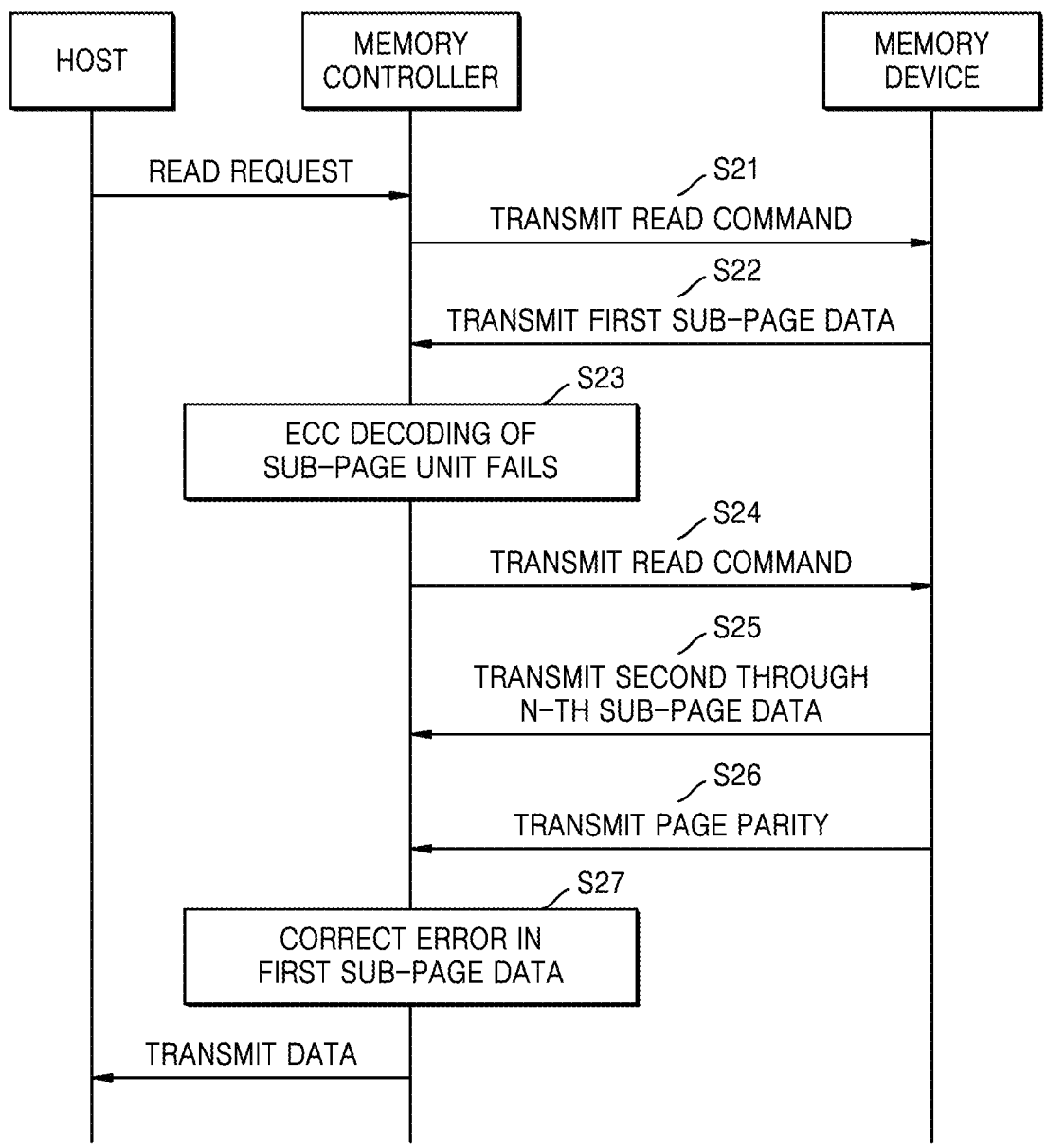

FIGS. 4 and 5 are flowcharts of an operation method of a memory system, according to some example embodiments.

Referring to FIG. 4, a host may transmit a write request and write data having a certain size to a memory system. The memory system may include a memory controller and a memory device. The memory controller may store a plurality of pieces of write data respectively corresponding to a plurality of write requests of the host and may perform ECC encoding on the write data of the page unit. For example, ECC encoding may be performed on each piece of sub-page data such that error correction may be performed in sub-page units in operation S11. Alternatively or additionally, ECC encoding may be performed in page units such that an error in a piece of sub-page data may be corrected based on other pieces of sub-page data in operation S12. After performing the ECC encoding described above, the memory controller may provide a program command based on the page unit to the memory device in operation S13. Together with the program command, a plurality of codewords and a page parity may be provided to the memory device.

The memory device may perform a program operation in page units in response to the program command in operation S14. In some examples of an operation, the memory device may store the codewords and the page parity, which are provided from the memory controller, in a page buffer, and may program the codewords and the page parity together to a page of a cell array.

Reading of data of a certain unit/certain chunk of bits such as contiguous bits may be requested by the host. The memory controller may transmit a read command to the memory system in operation S15 such that data is read according to the read request of the host. The size of data requested to be read may be smaller than the sub-page unit described above in some example embodiments. The memory device may read sub-page data including the data requested to be read and transmit the sub-page data to the memory controller in operation S16. The memory controller may perform ECC decoding on the sub-page data in sub-page units in operation S17 and may transmit error corrected data to the host according to an ECC decoding result of the sub-page unit.

FIG. 5 shows an example of an operation related to ECC decoding.

Referring to FIG. 5, a memory controller may receive a read request from a host and transmit, to a memory device, a read command for reading first sub-page data, which includes data requested by the host, in operation S21. The memory device may read a codeword including the first sub-page data in response to the read command and provide the codeword to the memory controller.

The memory controller may perform ECC decoding in sub-page units according to some example embodiments described above and determine that the ECC decoding fails according to an ECC decoding result in operation S23. Because an error in the first sub-page data has not been corrected (was uncorrectable), the memory controller may transmit a read command for reading a page parity and second through N-th sub-page data included in the same page as the first sub-page data in operation S24. The memory device may transmit the second through N-th sub-page data, which has been read in response to the read command, to the memory controller in operation S25, and may transmit the page parity, which has been read in response to the read command, to the memory controller in operation S26. The memory controller may correct an error in the first sub-page data by performing ECC decoding using the second through N-th sub-page data and the page parity in operation S27 and transmit error corrected first sub-page data to the host.

Figure 6:
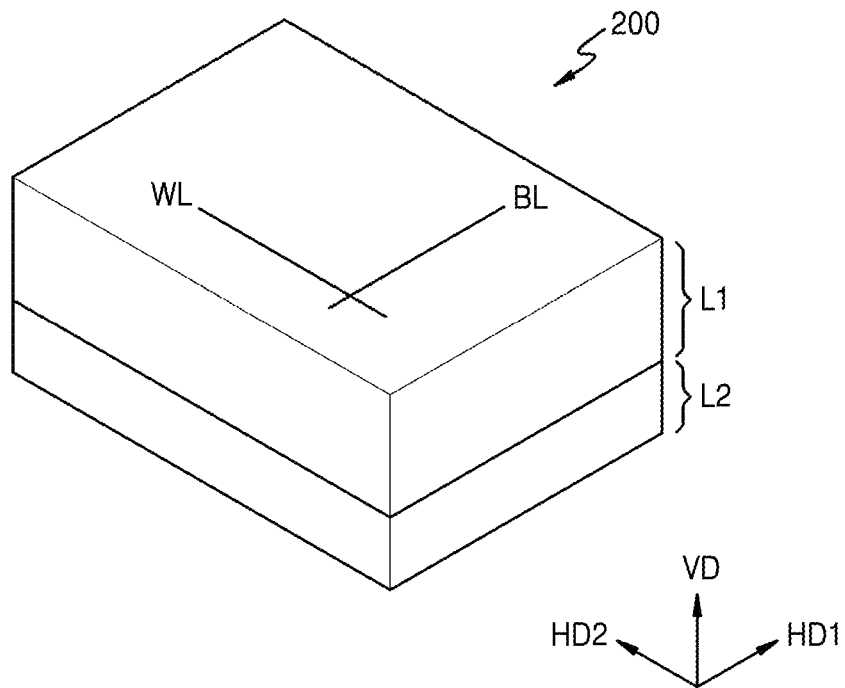
FIG. 6 is a schematic diagram illustrating the structure of a memory device in FIG. 1, according to some example embodiments.

FIG. 6 is a schematic diagram illustrating the structure of the memory device 200 in FIG. 1, according to some example embodiments. Although the memory device 200 has a cell over periphery (COP) structure in FIG. 6, embodiments are not limited thereto. The memory device 200 may have various structures.

Referring to FIGS. 1 through 6, the memory device 200 may include a first semiconductor layer L1 and a second semiconductor layer L2. The first semiconductor layer L1 may be stacked on the second semiconductor layer L2 in a vertical direction VD. For example, the second semiconductor layer L2 may be below the first semiconductor layer L1 in the vertical direction VD and thus be close to a substrate.

In some example embodiments, the cell array 210 in FIG. 1 may be formed in the first semiconductor layer L1, and peripheral circuits including the page buffer 220 and the control logic 230 in FIG. 1 may be formed in the second semiconductor layer L2. Accordingly, the memory device 200 may have a COP structure, in which the cell array 210 is above the peripheral circuits. The COP structure may effectively reduce a horizontal area and may increase the integration density of the memory device 200.

In some example embodiments, the second semiconductor layer L2 may include a substrate such as a semiconductor substrate comprising silicon. The peripheral circuits may be formed in the second semiconductor layer L2 by forming planar and/or three-dimensional transistors and metal patterns, which interconnect the transistors, on the substrate. After the peripheral circuits are formed in the second semiconductor layer L2, the first semiconductor layer L1 including the cell array 210 may be formed. Metal patterns, which electrically connect word lines WL and bit lines BL of the cell array 210 to the peripheral circuits in the second semiconductor layer L2, may be formed. For example, the word lines WL may extend in a first horizontal direction HD1, and the bit lines BL may extend in a second horizontal direction HD2.

Figure 7:
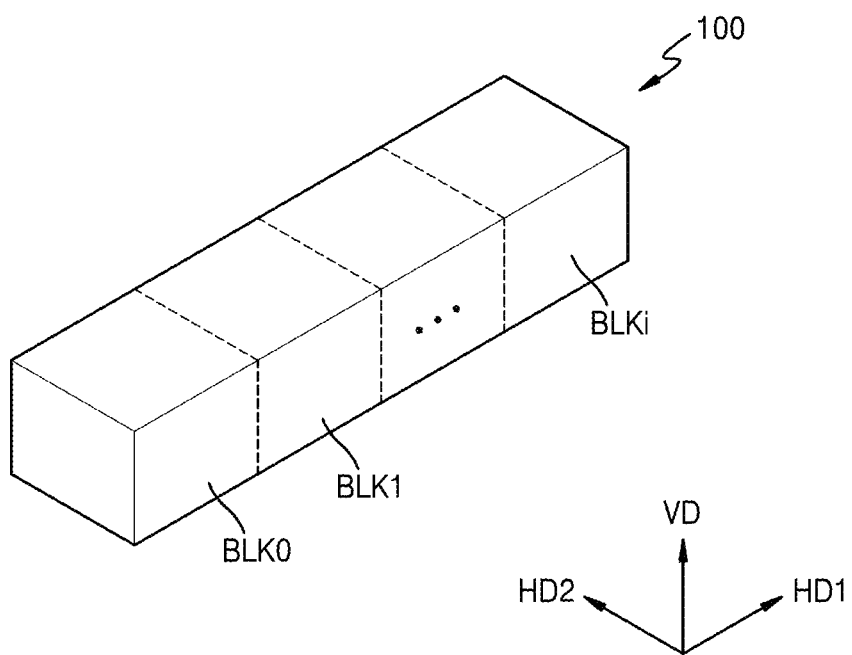
FIG. 7 is a diagram illustrating an example of a cell array in FIG. 1, according to some example embodiments.

FIG. 7 is a diagram illustrating an example of the cell array 210 in FIG. 1, according to some example embodiments.

Referring to FIG. 7, the cell array 210 may include a plurality of cell blocks BLK0 through BLKi, where "i" may be a positive integer. Each of the cell blocks BLK0 through BLKi may have a three-dimensional structure (or a vertical structure). In detail, each of the cell blocks BLK0 through BLKi may include a plurality of NAND strings extending in the vertical direction VD. For example, the NAND strings may be separated from each other by a certain distance in the first and second horizontal directions HD1 and HD2. The cell blocks BLK0 through BLKi may be selected by a row decoder (not shown). For example, the row decoder may select a cell block corresponding to a block address among the cell blocks BLK0 through BLKi.

Figure 8:
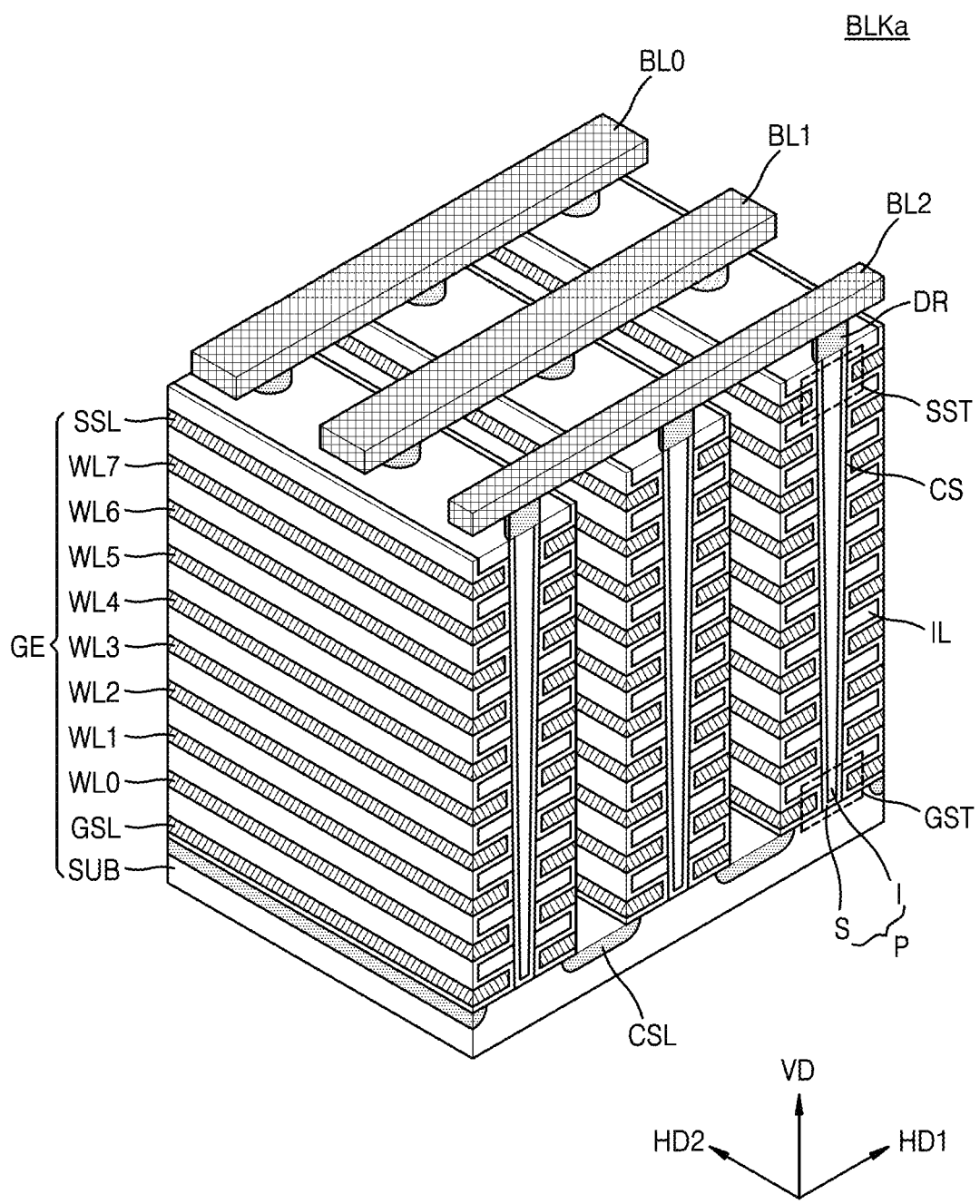
FIG. 8 is a perspective view of a cell block in FIG. 7, according to some example embodiments.

FIG. 8 is a perspective view of the cell block in FIG. 7, according to some example embodiments.

Referring to FIG. 8, the cell block BLKa is formed in a direction perpendicular to a substrate SUB. The substrate SUB has a first conductivity type (e.g., a p-type including dopants such as boron). A common source line CSL extends on the substrate SUB in the second horizontal direction HD2 and is doped with impurities of a second conductivity type (e.g., an n-type including dopants such as at least one of phosphorus or arsenic). On a region of the substrate SUB between two adjacent common source lines CSL, a plurality of insulating layers IL extend in the second horizontal direction HD and are sequentially provided in the vertical direction VD. The insulating layers IL are separated from each other by a certain distance in the vertical direction VD. For example, the insulating layers IL may include an insulating material such as silicon oxide.

On the region of the substrate SUB between two adjacent common source lines CSL, a plurality of pillars P pass through the insulating layers IL in the vertical direction VD. A plurality of pillars P are arranged in the first horizontal direction HD1. For example, the pillars P pass through the insulating layers IL to be in contact with the substrate SUB. In detail, a surface layer S of each pillar P may include a silicone material of the first conductivity type and may function as a channel region. An inner layer I of each pillar P may include an insulating material such as silicon oxide or an air gap.

In the region between two adjacent common source lines CSL, a charge storage layer CS is provided along the exposed surfaces of the insulating layers IL, the pillars P, and the substrate SUB. The charge storage layer CS may include a gate insulating layer (for example a "tunneling insulating layer"), a charge trap layer, and a blocking insulating layer. For example, the charge storage layer CS may have an oxide-nitride-oxide (ONO) structure. In the region between two adjacent common source lines CSL, gate electrodes GE such as selection lines GSL and SSL and word lines WL0 through WL7 are provided on an exposed surface of the charge storage layer CS.

Drains and/or drain contacts DR are respectively provided on the pillars P. For example, the drains or drain contacts DR may include a silicone material doped with impurities of the second conductivity type. Bit lines BL1 through BL3 extend on the drains DR in the first horizontal direction HD1 and are separated from each other by a certain distance in the second horizontal direction HD2.

FIGS. 9 and 10 are respectively diagrams or examples of a program operation performed in units of pages, according to some example embodiments. FIGS. 9 and 10 show examples, in which a single page includes four sub-pages and each memory cell corresponds to a quad-level cell (QLC) storing four bits of data, and accordingly, four pages of data are stored in memory cells connected to a single word line.

Referring to FIG. 9, sub-page data and a sub-parity corresponding thereto may be stored in each sub-page. For example, first through fourth sub-page data DATA_S1 through DATA_S4 and first through fourth sub-parities PAR_S1 through PAR_S4 may be stored in the same page. The page parity PAR_P corresponding to the first through fourth sub-page data DATA_S1 through DATA_S4 may also be stored in the page.

Referring to FIG. 10, based on the control of a memory controller, data of the page unit may be stored across a plurality of pages of a memory device. For example, the first sub-page data DATA_S1 and the first sub-parity PAR_S1 corresponding thereto may be stored in a first page. Similarly, other sub-page data and a corresponding sub-parity may be stored in another page of the same word line as that including the first page. The page parity PAR_P generated according to some example embodiments described above may be stored in one page. FIG. 10 shows some examples in which the page parity PAR_P is stored in a fourth page together with the fourth sub-page data DATA_S4 and the fourth sub-parity PAR_S4.

As described in example embodiments of FIG. 10, because multiple bits of data are stored in each memory cell, multiple pages of data may be stored in a single word line, and data of the page unit including the page parity PAR_P may be stored across at least two pages in various forms. Accordingly, the degree of degradation of each page may be different. Even when an error occurrence frequency increases in a certain page, the error occurrence frequency may be uniform in data of the page unit because a plurality of pieces of sub-page data may be stored in a plurality of pages in a distributed fashion, and accordingly, error correction performance for the page unit may be enhanced.

Figure 11:
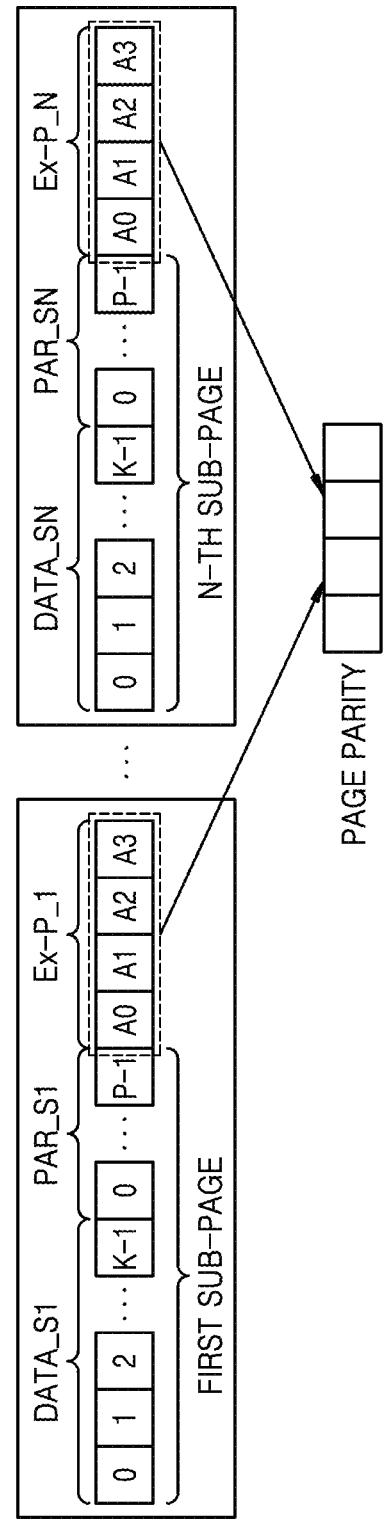
FIG. 11 is a conceptual diagram illustrating an example of generating a page parity, according to some example embodiments.

FIG. 11 is a conceptual diagram illustrating an example of generating a page parity, according to some example embodiments. In example embodiments shown in FIG. 11, a single page includes first through N-th sub-pages, sub-page data includes K bits, and a sub parity includes P bits. In example embodiments of FIG. 11, each of a page parity and an extra parity generated from at least some bits in each codeword includes four bits, but embodiments are not limited thereto.

Referring to FIG. 11, an extra parity may be generated with respect to each of the first through N-th sub-pages. For example, a first extra parity Ex-P_1 may be generated based on at least some bits in the first sub-page data DATA_S1 and the first sub-parity PAR_S1. Similarly, an N-th extra parity Ex-P_N may be generated based on at least some bits in N-th sub-page data DATA_SN and an N-th sub-parity PAR_SN. An extra parity may be generated through various certain operations. For example, the first extra parity Ex-P_1 may be generated based on an error correction algorithm so as to include information for correcting an error in the first sub-page data DATA_S1. The page parity PAR_P described above may be generated using the first through N-th extra parities Ex-P_1 through Ex-P_N.

In an implementation, each of the first through N-th extra parities Ex-P_1 through Ex-P_N may be calculated from a corresponding sub-page data (or codeword), without being stored in a memory system. The page parity PAR_P may be generated through various operations such as a component-wise XOR operation on the first through N-th extra parities Ex-P_1 through Ex-P_N. However, example embodiments are not limited to a particular operation.

Figure 12:
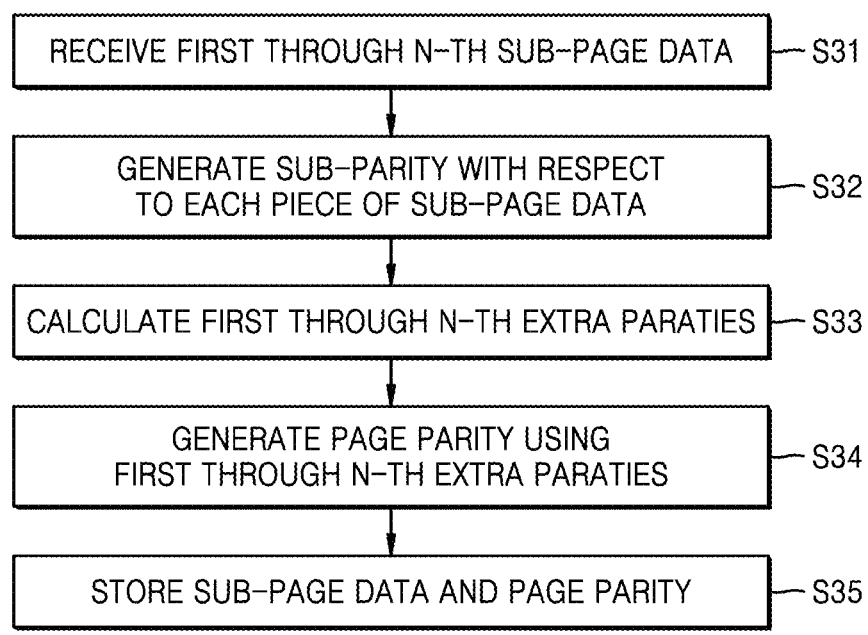
FIGS. 12 through 13B are respectively flowcharts of examples of error correction code (ECC) encoding and ECC decoding of a memory system according to the embodiment of FIG. 11.
Figure 13A:
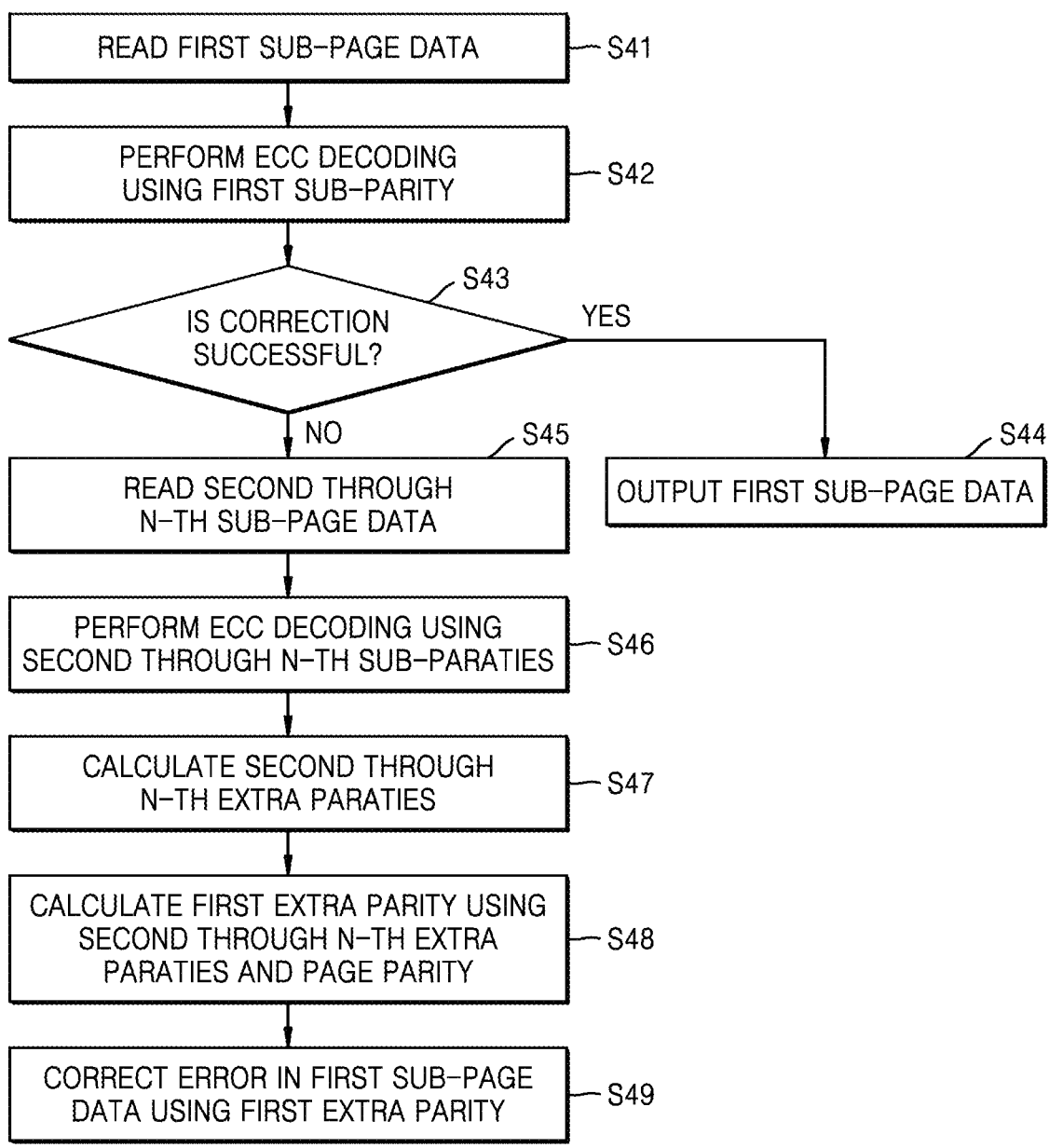
Figure 13B:
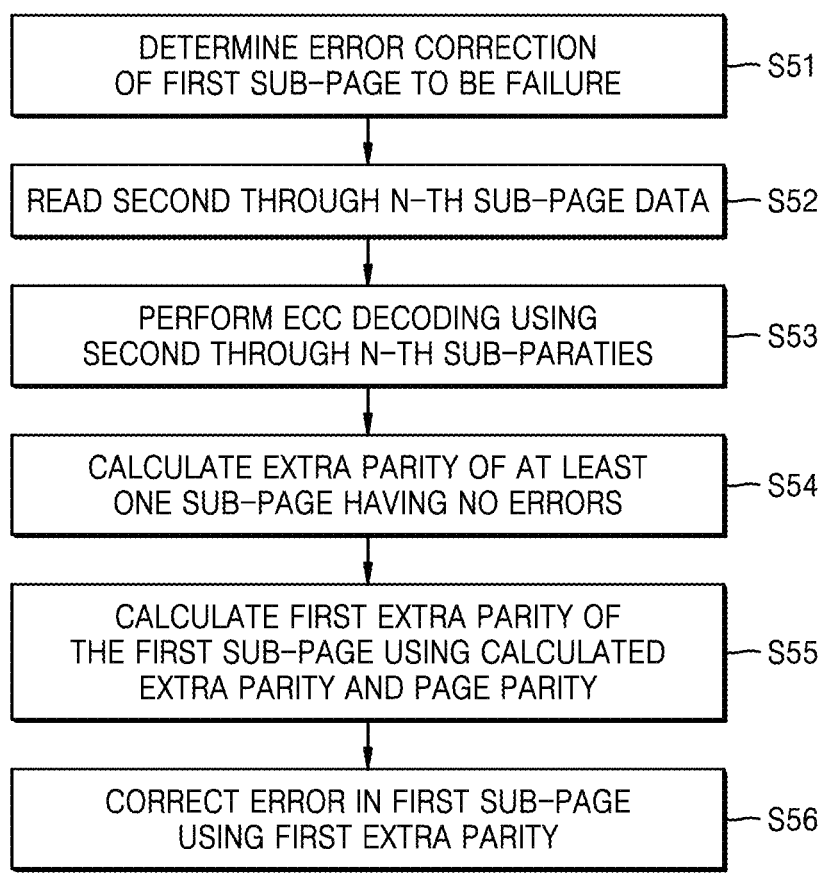

FIGS. 12 through 13B are respectively flowcharts of examples of ECC encoding and ECC decoding of a memory system according to example embodiments of FIG. 11.

Referring to FIGS. 11 and 12, the memory controller may receive the first through N-th sub-pages from a host in operation S31 and may generate a sub-parity with respect to each piece of sub-page data by performing ECC encoding in sub-page units in operation S32. Accordingly, each sub-page may form an ECC decoding unit. When a data read request is received from the host, error correction may be executed by performing ECC decoding in sub-page units.

To generate a page parity, an extra parity may be calculated by performing an operation on each of first through N-th sub-page data. Accordingly, first through N-th extra parities respectively corresponding to the first through N-th sub-page data may be calculated in operation S33. Each extra parity may include information for correcting an error in corresponding sub-page data (and/or a corresponding codeword).

The page parity corresponding in common to the first through N-th sub-page data may be generated based on a certain operation on the first through N-th extra parities in operation S34. According to some example embodiments described above, the first through N-th sub-page data (or first through N-th codewords) and the page parity may be stored in a memory device through a program operation performed in page units in operation S35. According to some example embodiments, the first through N-th extra parities may not be stored in the memory device.

Referring to FIGS. 11 and 13A, according to some example embodiments described above, data of the page unit including the first through N-th sub-page data may be stored in a page of the memory device. A read request for the first sub-page data may be received from the host. Accordingly, a read operation may be performed on the first sub-page data in operation S41. For example, a data size corresponding to the read request of the host may be smaller than or equal to the size of the first sub-page, and the memory device may read data in predetermined sub-page units.

The memory controller may receive the first sub-page data from the memory device and may perform ECC decoding using the first sub-parity in operation S42. Whether error correction using the ECC decoding is successful may be determined in operation S43. When the error correction is successful, the first sub-page data may be output to the host.

When the error correction fails, the second through N-th sub-page data may be read as other sub-page data forming the page in operation S45, and ECC decoding may be performed on the second through N-th sub-page data using the second through N-th sub-parities in operation S46, such that an error in each of the second through N-th sub-page data may be corrected. When an error in each sub-page is corrected by performing ECC decoding in sub-page units, the second through N-th extra parities may be calculated in operation S47 by performing an operation of calculating extra parities using the second through N-th sub-page data according to some example embodiments described above.

Thereafter, the first extra parity corresponding to the first sub-page data may be calculated using the calculated second through N-th extra parities and the page parity read from the memory device in operation S48. An error in the first sub-page data may be corrected by performing ECC decoding using the first extra parity in operation S49.

In example embodiments described above, a page parity is generated using an extra parity related to each piece of sub-page data, but example embodiments are not limited thereto. For example, at least some bits may be selected from each piece of sub-page data, a parity may be generated by performing ECC encoding on a unit including the selected bits, and the parity may be used as the page parity described above.

In relation with ECC encoding, a parity may be generated in various manners. For example, ECC encoding may be performed in a systematic manner such that sub-page data is separated from a sub-parity. Alternatively or additionally, when ECC encoding is performed in a nonsystematic manner, a codeword may be generated such that a bit value of sub-page data is changed.

FIG. 13B is a flowchart of error correction according to some example embodiments. Referring to FIG. 13B, error correction may be performed on the first sub-page, which is read according to a request of the host. The error correction may be determined to be a failure in operation S51. According to some example embodiments described above, data of the second through N-th sub-pages may be read in operation S52 for error correction of the first sub-page. ECC decoding may be performed using a sub-parity of each of the second through N-th sub-pages in operation S53.

According to some example embodiments, an extra parity may be calculated using various algorithms (e.g., an error correction algorithm). An extra parity of a sub-page may be calculated selectively using the extra parities of some of the other sub-pages. In other words, according to an algorithm, an extra parity may be calculated based on various kinds of operations. According to some example embodiments, the memory system may calculate the extra parity of the first sub-page based on extra parities of some sub-pages selected from the second through N-th sub-pages.

At least some of the second through N-th sub-pages may have no errors, or may have an error corrected through ECC decoding on the second through N-th sub-pages. According to some example embodiments, an extra parity of at least one sub-page, which has no errors (or an error corrected) among the second through N-th sub-pages, may be calculated in operation S54. The first extra parity of the first sub-page may be calculated using the calculated extra parity and the page parity in the embodiment described above in operation S55. An error in the first sub-page data may be corrected using the first extra parity in operation S56.

According to some example embodiments described above, an extra parity of a sub-page having an error may be generated using an extra parity, which is generated based on a sub-page having no errors. An error in the sub-page may be corrected based on the generated extra parity, and therefore, error correction accuracy may be increased.

Figure 14:
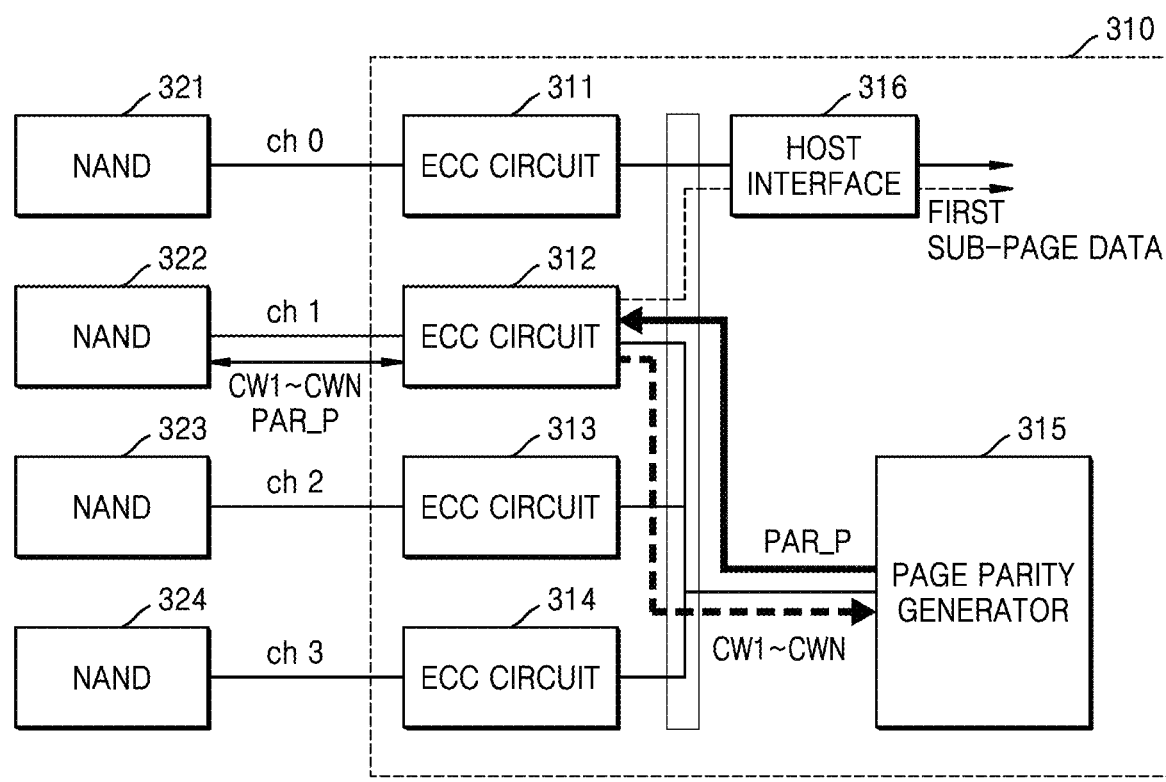
FIG. 14 is a block diagram illustrating an implementation of a memory system according to some example embodiments.

FIG. 14 is a block diagram illustrating an implementation of a memory system according to some example embodiments. Referring to FIG. 14, a memory controller 310 is connected to a plurality of NANDs, e.g., first through fourth NANDs 321 through 324, each one acting as a memory device, through a plurality of channels ch0 through ch3, respectively. In correspondence to the first through fourth NANDs 321 through 324, a plurality of ECC circuits, e.g., first through fourth ECC circuits 311 through 314, which perform ECC encoding and ECC decoding, are provided. FIG. 14 shows an example of ECC encoding and decoding for the second NAND 322.

In some example embodiments, a page parity generator 315 may generate the page parity PAR_P that may be provided in common to the channels ch0 through ch3. In other words, the page parity generator 315 may be configured to be shared by the first through fourth NANDs 321 through 324.

In an operation of the second ECC circuit 312, a program operation may be performed in units of pages of the second NAND 322, and the second ECC circuit 312 may generate the first through N-th codewords CW1 through CWN by performing ECC encoding on the first through N-th sub-page data. The first through N-th codewords CW1 through CWN may be provided to the page parity generator 315. The page parity generator 315 may calculate an extra parity with respect to each of the first through N-th codewords CW1 through CWN, according to some example embodiments described above, generate the page parity PAR_P through an operation using the calculated extra parity, and provide the page parity PAR_P to the second ECC circuit 312. The first through N-th codewords CW1 through CWN and the page parity PAR_P may be programmed to the second NAND 322 in page units.

At the request of the host, a read operation may be performed on the second NAND 322 in sub-page units, and the first codeword CW1 may be read and provided to the memory controller 310. The second ECC circuit 312 may perform ECC decoding in sub-page units using a sub-parity included in the first codeword CW1. When error correction fails, the second through N-th codewords CW2 through CWN and the page parity PAR_P may be read from the second NAND 322 based on the control of the memory controller 310 and provided to the memory controller 310.

The second through N-th codewords CW2 through CWN and the page parity PAR_P may be provided to the page parity generator 315, and the page parity generator 315 may calculate an extra parity corresponding to the first codeword CW1 by performing an operation using the page parity PAR_P and extra parities, which are calculated from the second through N-th codewords CW2 through CWN. An error in the sub-page data of the first codeword CW1 may be corrected using the calculated extra parity corresponding to the first codeword CW1, and error-corrected sub-page data may be provided to the host through the host interface 316.

Although the page parity generator 315 is shared by a plurality of NANDs, e.g., the first through fourth NANDs 321 through 324, example embodiments are not limited thereto. For example, a plurality of page parity generators 315 may be respectively provided for the first through fourth NANDs 321 through 324, and each page parity generator 315 may generate the page parity PAR_P, which is related to data stored in a corresponding NAND or data read from the corresponding NAND.

Figure 15B:
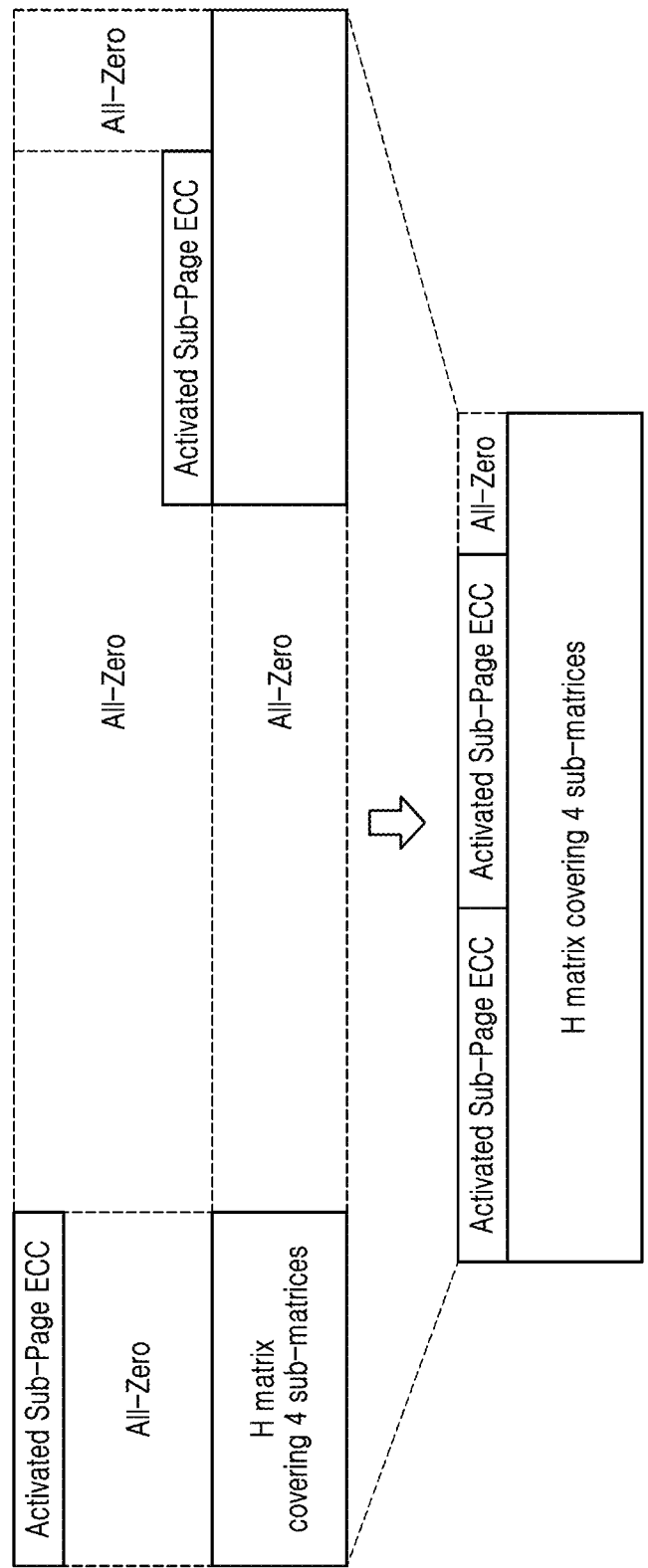

FIGS. 15A and 15B are respectively diagrams illustrating implementations of a parity based on low-density parity-check codes (LDPC), according to some example embodiments. FIG. 15A illustrates an implementation of a sub-parity and a page parity. FIG. 15B is a diagram illustrating the concept of correcting an error in first and fourth sub-pages based on LDPC.

Referring to FIG. 15A, a parity based on LDPC may include a parity-check matrix (H matrix). A parity-check matrix (e.g., a sub H matrix) for each piece of first through fourth sub-page data and an H matrix for page data may be generated through ECC encoding based on LDPC. Each of an H matrix of the sub-page unit and an H matrix of the page unit may include a sub-matrix and/or a zero matrix According to some example embodiments described above, information of an H matrix for sub-page data may be stored in correspondence to the sub-parity described above, and information of an H matrix for page data may be stored in correspondence to the page parity described above.

It may be assumed in FIG. 15A that errors in the second and third sub-page data have been corrected and errors in the first and fourth sub-page data have not been corrected. An error in data may be corrected based on the correlation between a plurality of check nodes and a plurality of variable nodes, which are defined by the values of an H matrix. As shown in FIG. 15B, an H matrix may be regenerated by initializing the information of the check nodes by reflecting error-free data. For example, the regenerated H matrix may be based on at least part of the information of the sub H matrices respectively corresponding to the first through fourth sub-page data and at least part of the information of the H matrix for the page parity. Based on this fact, ECC decoding may be performed on the first through fourth sub-page data.

In FIGS. 15A and 15B, a partially-decodable LDPC structure based on a superposition matrix is used, and as many errors as the number of corrected sub-pages may be corrected. However, embodiments are not limited to a particular method.

Figure 16:
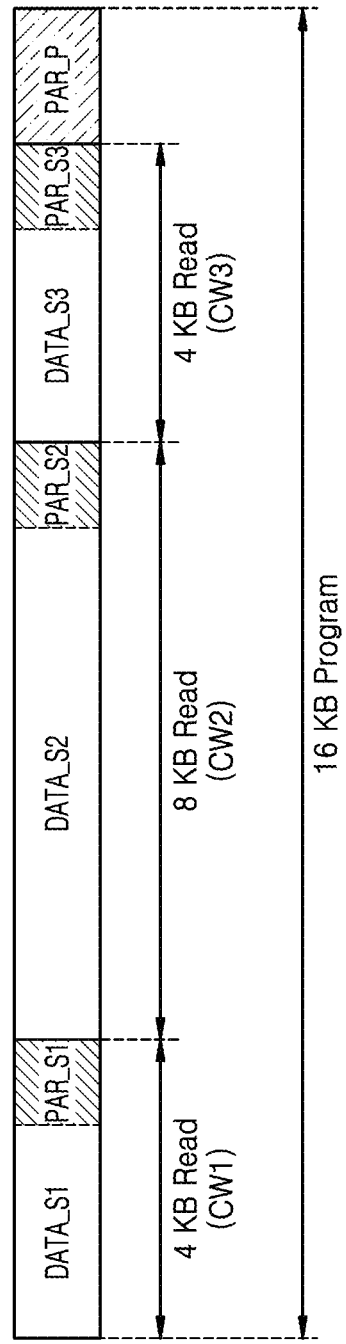
FIG. 16 is a diagram illustrating read units, according to various embodiments.

FIG. 16 is a diagram illustrating read units, according to some example embodiments. In FIG. 16, a single page has a size of 16 KB and includes three sub-pages.

Referring to FIG. 16, a single page may store a plurality of codewords and the page parity PAR_P corresponding thereto, according to some example embodiments described above. In FIG. 16, the first through third codewords CW1 through CW3 are stored in the page as a plurality of codewords, and each of the first and third codewords CW1 and CW3 has a size of 4 KB and the second codeword CW2 has a size of 8 KB.

When the first through third codewords CW1 through CW3 are generated, the first sub-parity PAR_S1 may include information for correcting an error in the first sub-page data DATA_S1 having a size of 4 KB, the third sub-parity PAR_S2 may include information for correcting an error in the third sub-page data DATA_S3 having a size of 4 KB, and the second sub-parity PAR_S2 may include information for correcting an error in the second sub-page data DATA_S2 having a size of 8 KB. The page parity PAR_P may be generated based on the first through third codewords CW1 through CW3.

According to some example embodiments, a read unit/size may be changed. For example, when a unit of a read request of the host is less than or equal to 4 KB, one of the first through third codewords CW1 through CW3 may be selectively read in response to the read request of the host, and ECC decoding may be performed in sub-page units using a sub-parity included in the read codeword. According to some example embodiments, the first through third codewords CW1 through CW3 may have different sizes, e.g. different sizes in powers of 2, and accordingly, error correction capability is different with respect to each sub-page when ECC decoding is performed in sub-page units. For example, the size of the second codeword CW2 is relatively large (e.g. 8-KB), and accordingly, error correction performance using the second sub-parity PAR_S2 of the second codeword CW2 may be relatively high as compared to the other codewords.

In some example embodiments described above, codewords of one page have different sizes, but embodiments may be implemented in various forms. For example, some pages may include 4-KB sub-pages and other pages may include 8-KB sub-pages, and accordingly, error correction performance in sub-page units may be different with respect to each page. Data storage may be controlled taking account of the error correction performance. For example, data storage may be controlled such that data having a high level of importance among metadata is stored in an area having high error correction performance.

Figure 17:
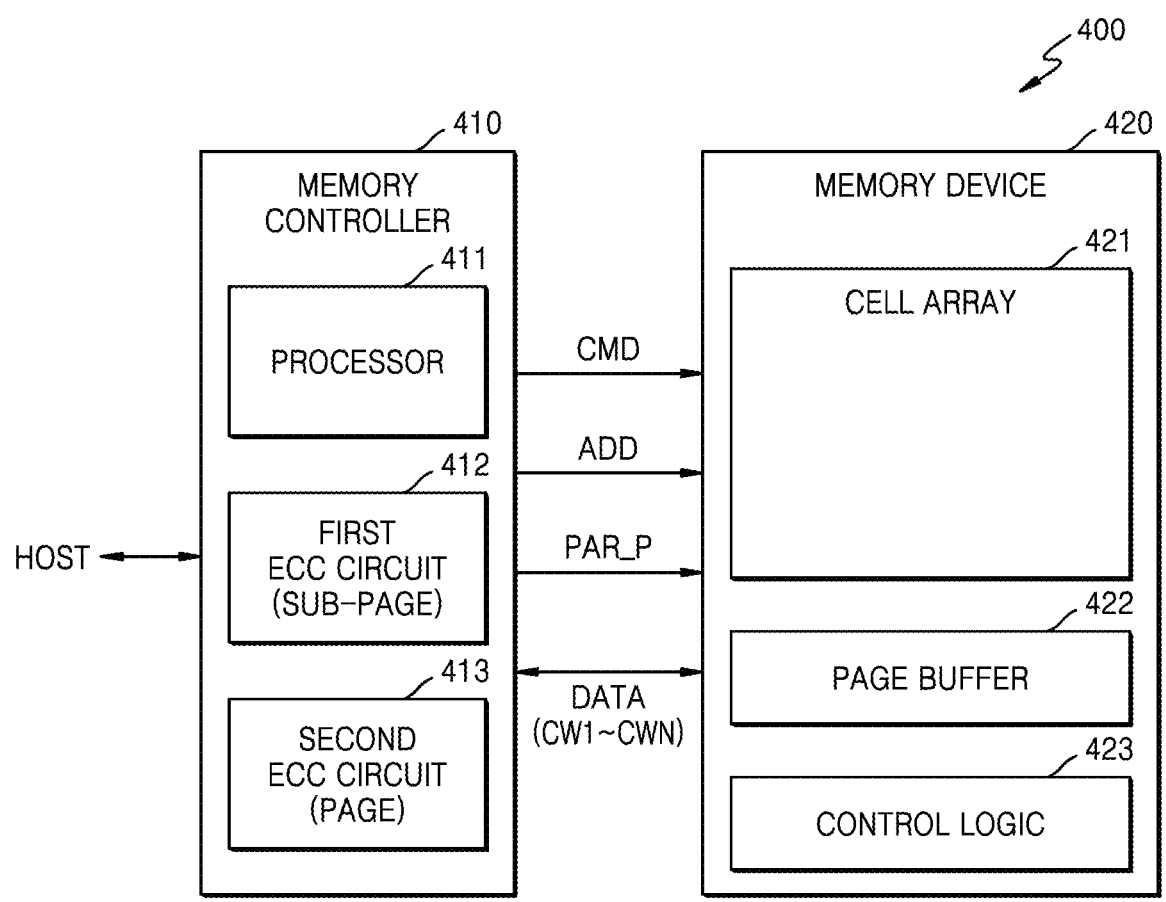
FIG. 17 is a block diagram of a memory system according to some example embodiments.

FIG. 17 is a block diagram of a memory system 400 according to some example embodiments.

Referring to FIG. 17, the memory system 400 may include a memory controller 410 and a memory device 420. The memory device 420 may include a cell array 421, a page buffer 422, and a control logic 423. The memory controller 410 may include a processor 411, a first ECC circuit 412, and a second ECC circuit 413. Detailed descriptions of elements described above in some example embodiments among the elements of FIG. 17 will be omitted.

The processor 411 may generally control operations of the memory system 400 and control program and read operations performed in various units according to some example embodiments described above. The first ECC circuit 412 may perform ECC encoding and decoding in sub-page units, and the second ECC circuit 413 may perform ECC encoding and decoding in page units.

When sub-page data is composed of at least one piece of write data from the host, the first ECC circuit 412 may perform ECC encoding in sub-page units and generate a sub-parity, according to some example embodiments described above. A codeword may be generated through the ECC encoding in sub-page units and provided to the second ECC circuit 413.

When a plurality of codewords forming a single page are provided from the first ECC circuit 412 to the second ECC circuit 413, the second ECC circuit 413 may perform ECC encoding in page units and thus generate the page parity PAR_P according to some example embodiments described above.

In a data read operation, data may be read in sub-page units according to some example embodiments described above, and the first ECC circuit 412 may correct an error in the sub-page data by performing ECC decoding using the sub-parity. When an error in the sub-page data has been normally corrected, the sub-page data may be provided to the host, without additionally performing ECC decoding using the second ECC circuit 413. Otherwise, when an error in the sub-page data has not be corrected, other codewords of the page and the page parity PAR_P may be provided to the second ECC circuit 413, and ECC decoding may be performed in page units.

In example embodiments of FIG. 17, the first ECC circuit 412 and the second ECC circuit 413 may generate a parity using the same error correction algorithm or different error correction algorithms.

Figure 18A:
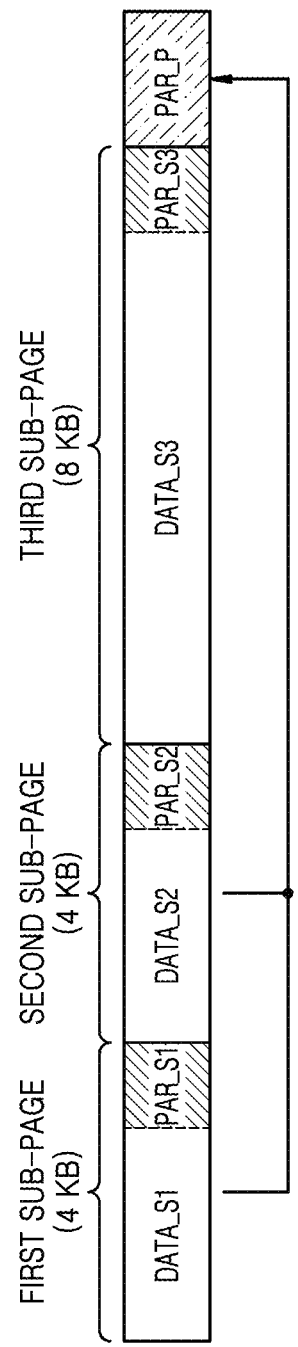
FIGS. 18A through 18C are diagrams illustrating examples of generating a page parity, according to various embodiments.
Figure 18B:
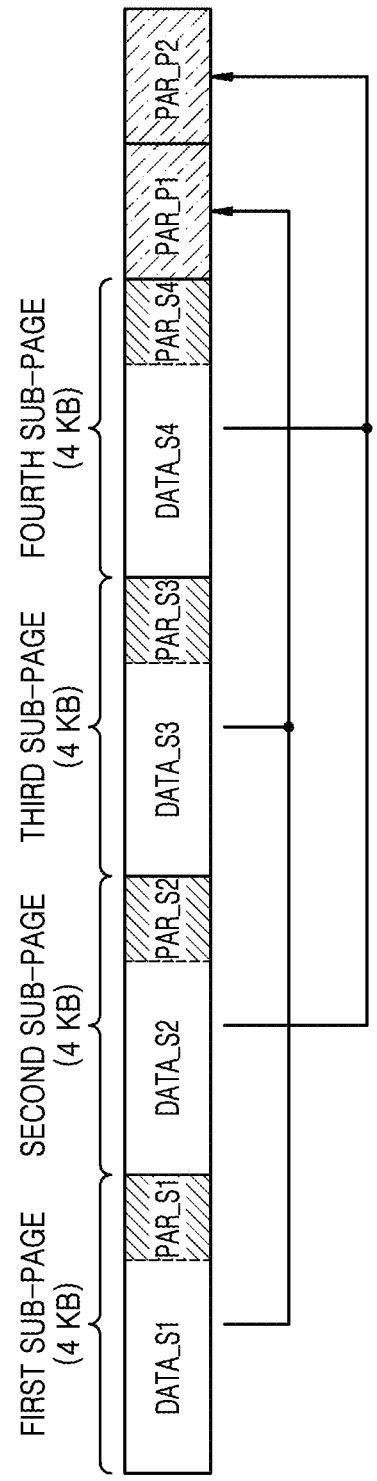
Figure 18C:
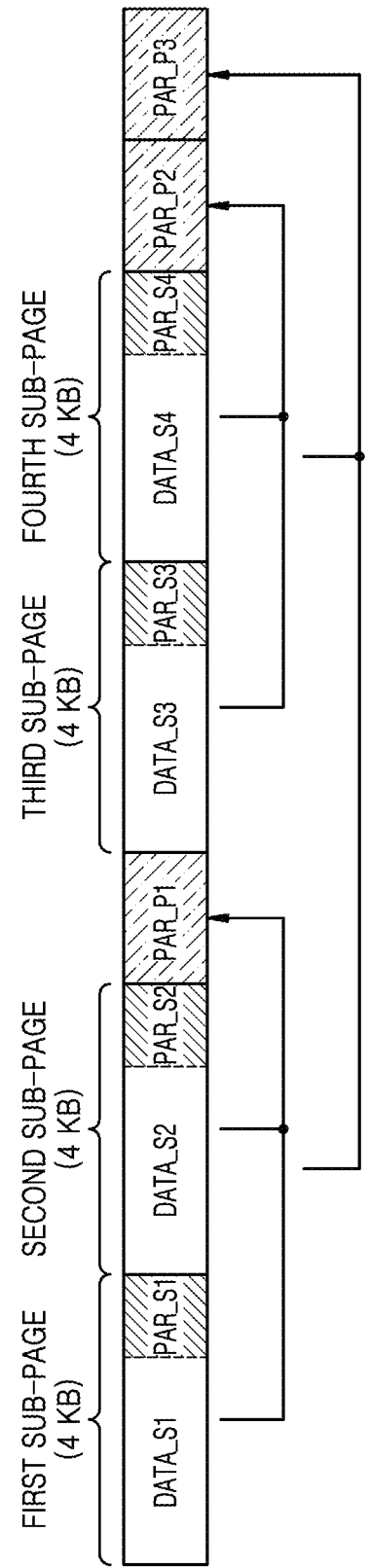

FIGS. 18A through 18C are diagrams illustrating examples of generating a page parity, according to various embodiments.

Referring to FIG. 18A, a single page includes a plurality of sub-pages, some sub-pages (e.g., first and second sub-pages) have a size of 4 KB, and another sub-page (e.g., a third sub-page) has a size of 8 KB. According to some example embodiments, the page parity PAR_P may correspond to some sub-pages of the page. For example, the page parity PAR_P may be generated based on sub-page data pieces (or codewords) having a size of 4 KB. For example, the sub-pages of the page may have different error correction capability, and a sub-page used to generate the page parity PAR_P may be selected based on the error correction capability.

Referring to FIG. 18B, at least two page parities, e.g., a first page parity PAR_P1 and a second page parity PAR_P2, may be generated for a single page. For example, in relation with first through fourth sub-pages of a single page, the first page parity PAR_P1 is generated based on the first and third sub-pages, and the second page parity PAR_P2 is generated based on the second and fourth sub-pages. When an error in the first sub-page is not corrected through ECC decoding in sub-page unit, some sub-pages may be selectively read and the first page parity PAR_P1 may be read to correct an error in the first sub-page.

FIG. 18C shows some example implementations of a page parity. For example, the first page parity PAR_P1 may be generated for some sub-pages (e.g., the first and second sub-pages), and the second page parity PAR_P2 may be generated for the other sub-pages (e.g., the third and fourth sub-pages). In some example embodiments of FIG. 18C, each of the first page parity PAR_P1 and the second page parity PAR_P2 may correspond to a size of a portion of a page but may correspond to the page parity according to some example embodiments described above in relation with error correction, and therefore, each of the first page parity PAR_P1 and the second page parity PAR_P2 may be referred to as a page parity.

A third page parity PAR_P3 may be generated for a single page (e.g., the first through fourth sub-pages). According to the implementation described above, error correction of some sub-pages (e.g., the first and second sub-pages) of a page based on a page parity may be separately performed from error correction of other sub-pages (e.g., the third and fourth sub-pages) of the page based on a page parity, and an error correction operation according to some example embodiments described above may be efficiently performed. In addition, when error correction is not executed on some units of a page using a page parity, an error correction operation may be newly performed using other units of the page and the third page parity PAR_P3, and accordingly, error correction accuracy may be increased.

Figure 19A:
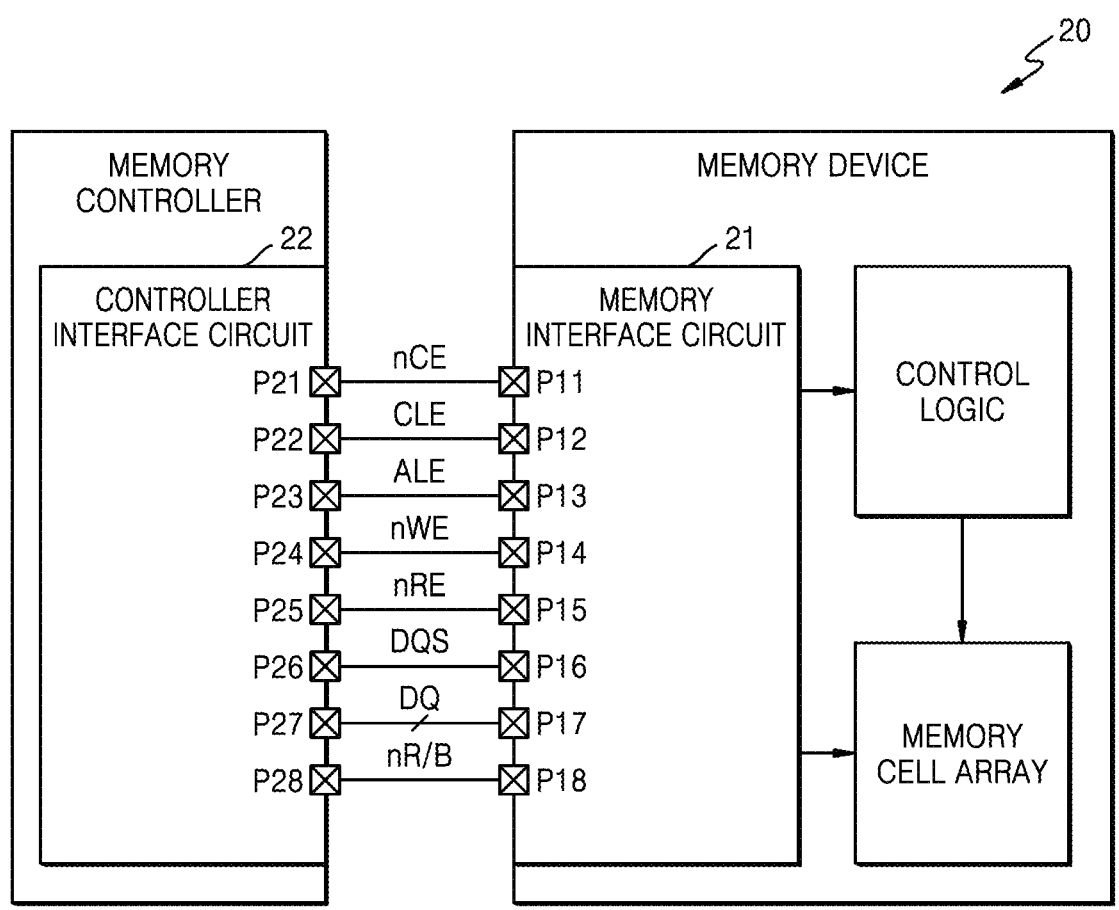
FIGS. 19A through 19C are diagrams illustrating an example of an interface between a memory controller and a memory device.
Figure 19B:
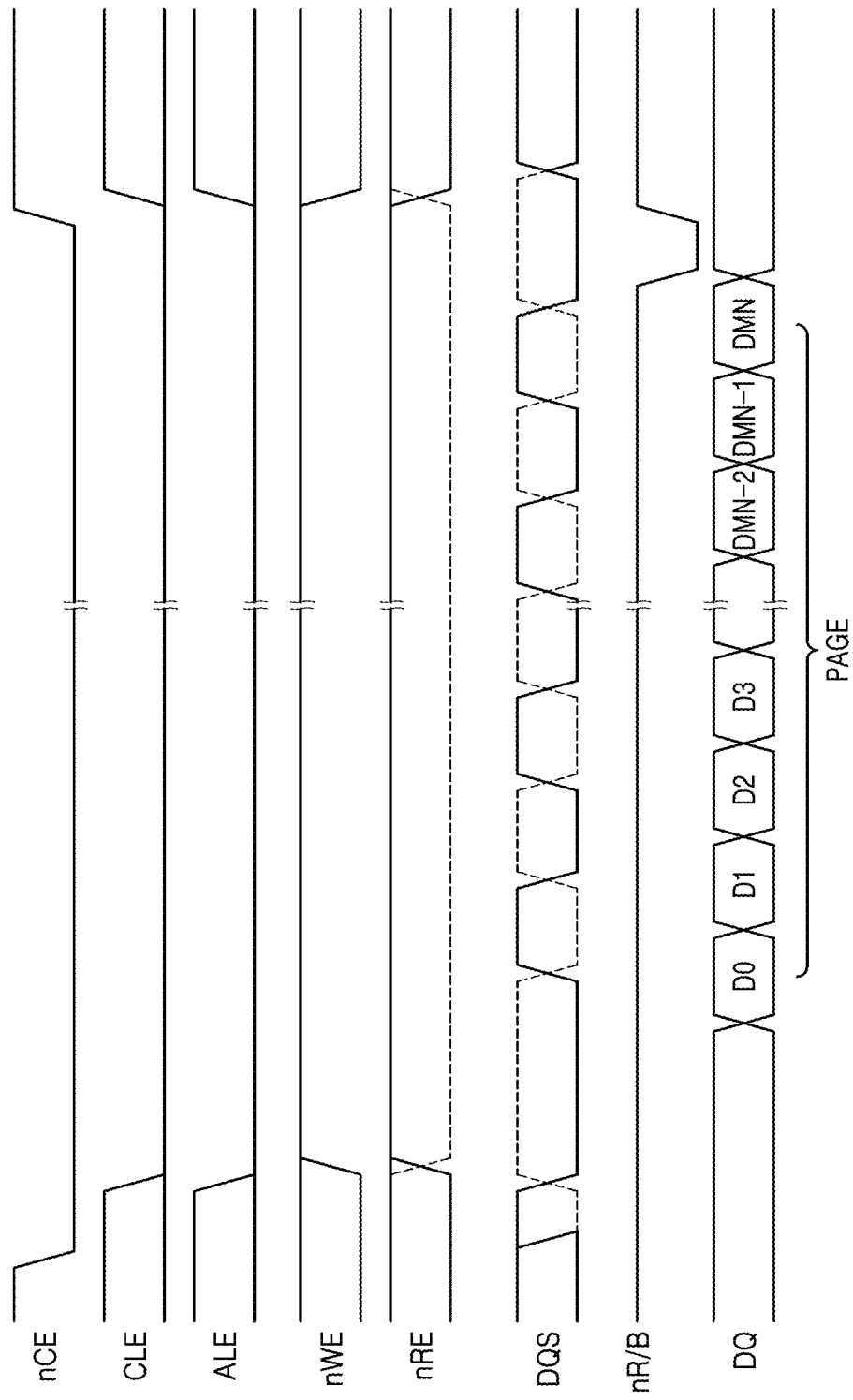
Figure 19C:
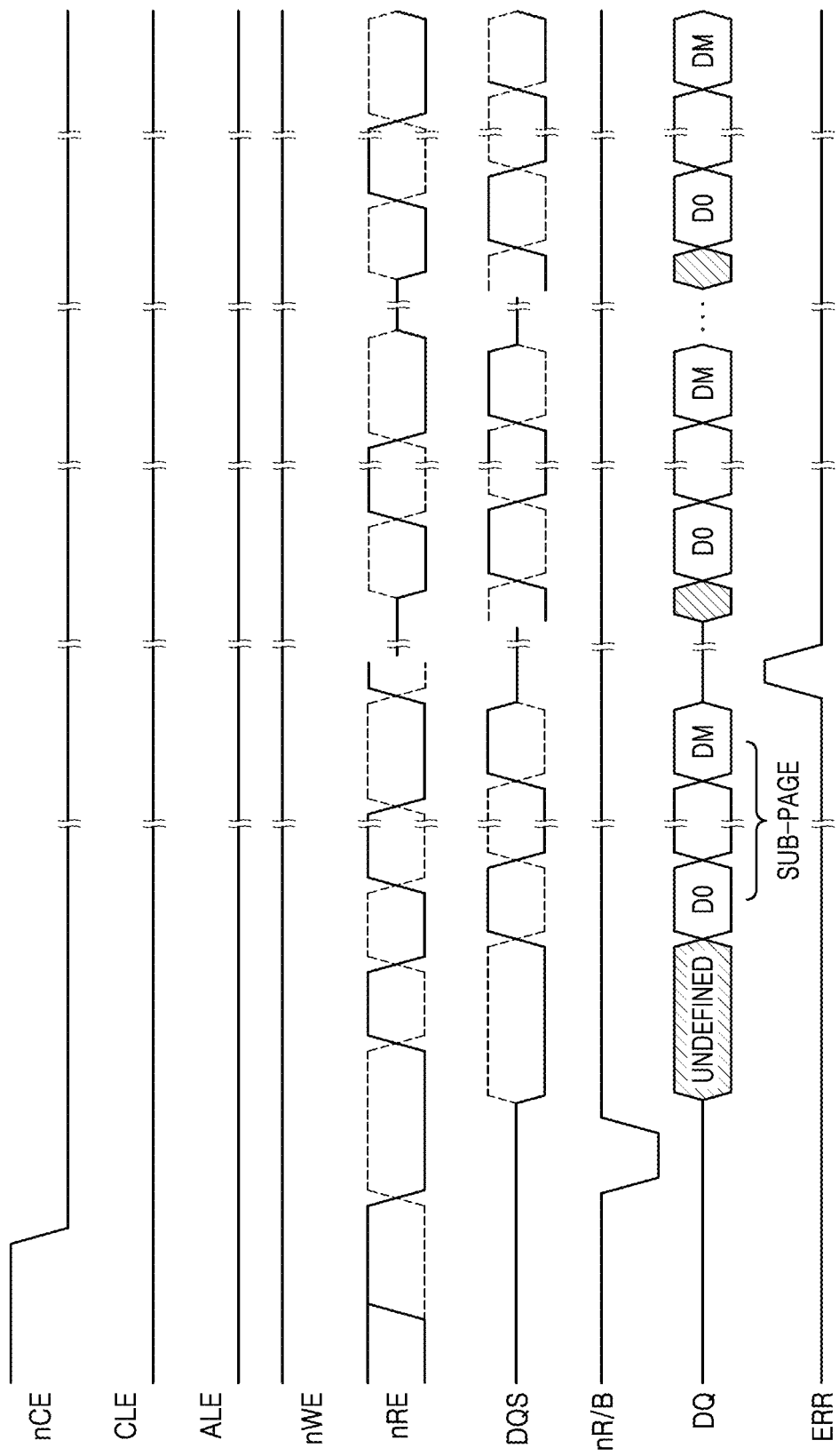

FIGS. 19A through 19C are diagrams illustrating an example of an interface between a memory controller and a memory device.

Referring to FIG. 19A, a memory system 20 may include a memory device and a memory controller. The memory device may include a memory interface circuit 21, and the memory controller may include a controller interface circuit 22. The memory interface circuit 21 may include first through eighth pins P11 through P18, and the controller interface circuit 22 may include ninth through sixteenth pins P21 through P28.

According to some example embodiments, as a program unit is different from a read unit, the size of data exchanged between the memory interface circuit 21 and the controller interface circuit 22 may be different between a program operation and a read operation. FIG. 19B illustrates an example of signal waveforms in a program operation, and FIG. 19C illustrates an example of signal waveforms in a read operation. In FIGS. 19B and 19C, for convenience of description, data DQ is exchanged. However, a command and an address may be transmitted in program and read operations. In an implementation, the command and the address may be transmitted through a data bus.

Referring to FIGS. 19B and 19C, when a chip enable signal nCE is enabled (e.g., at a low level), various signals may be exchanged between the memory interface circuit 21 and the controller interface circuit 22. For example, a command may be provided to the memory interface circuit 21 in an enable period (e.g., a high level state) of a command latch enable signal CLE based on toggle timings of a write enable signal nWE. Alternatively or additionally, based on the toggle timings of the write enable signal nWE, an address may be provided to the memory interface circuit 21 in an enable period (e.g., a high level state) of an address latch enable signal ALE. For example, the write enable signal nWE may toggle in a period in which the command and the address are transmitted. In the examples illustrated in FIGS. 19B and 19C, transmission of the command and the address is omitted for convenience of description, and therefore, the toggling of the write enable signal nWE may not be shown. The memory interface circuit 21 may receive a data strobe signal DQS and may receive the data DQ based on the data strobe signal DQS.

In a read (or data output) operation, the memory interface circuit 21 may receive a read enable signal nRE, which toggles, and generate the data strobe signal DQS, which toggles, based on toggling of the read enable signal nRE. The memory interface circuit 21 may transmit the data DQ to the controller interface circuit 22 based on the toggle timings of the data strobe signal DQS.

A ready/busy output signal nR/B may be transmitted between the memory interface circuit 21 and the controller interface circuit 22 in program and read operations. When the memory device is in a busy state (that is, when internal operations of the memory device are being performed), the memory interface circuit 21 may transmit the ready/busy output signal nR/B indicating the busy state to the memory controller. For example, while the memory device is writing data stored in a page buffer to a page or storing data read from a page in the page buffer, the memory interface circuit 21 may transmit the ready/busy output signal nR/B indicating the busy state (e.g., a low level) to the memory controller.

As shown in FIGS. 19B and 19C, while data D0 through DMN corresponding to a size of the page unit is transmitted to the memory interface circuit 21 in synchronization with the data strobe signal DQS in a program operation, data D0 through DM corresponding to a size of the sub-page unit may be transmitted to the control interface circuit 22 in synchronization with the data strobe signal DQS in a read operation. In other words, various kinds of signals and the data DQ may be exchanged between the memory interface circuit 21 and the control interface circuit 22 according to the examples of waveforms illustrated in FIGS. 19B and 19C. According to some example embodiments, the size of the data D0 through DMN transmitted in a program operation may be greater than the size of the data D0 through DM transmitted in a read operation. In the example of FIG. 19C, after the data D0 through DM corresponding to the sub-page unit is output in the read operation, the memory controller performs ECC decoding on the data D0 through DM. When error correction fails, error information ERR indicating error correction failure is provided to the memory device. For example, when error correction of a first sub-page fails, the memory device may receive the error information ERR that is activated and thus output data of other sub-pages (e.g., second through N-th sub-pages) included in a single page to the memory controller. According to some example embodiments described above, the memory controller may correct an error in a certain sub-page. Although the error information ERR is separately illustrated in FIG. 19C, the memory device may be notified of error correction failure based on a combination of various kinds of signals illustrated in FIGS. 19B and 19C, without separately receiving the error information ERR.

Figure 20:
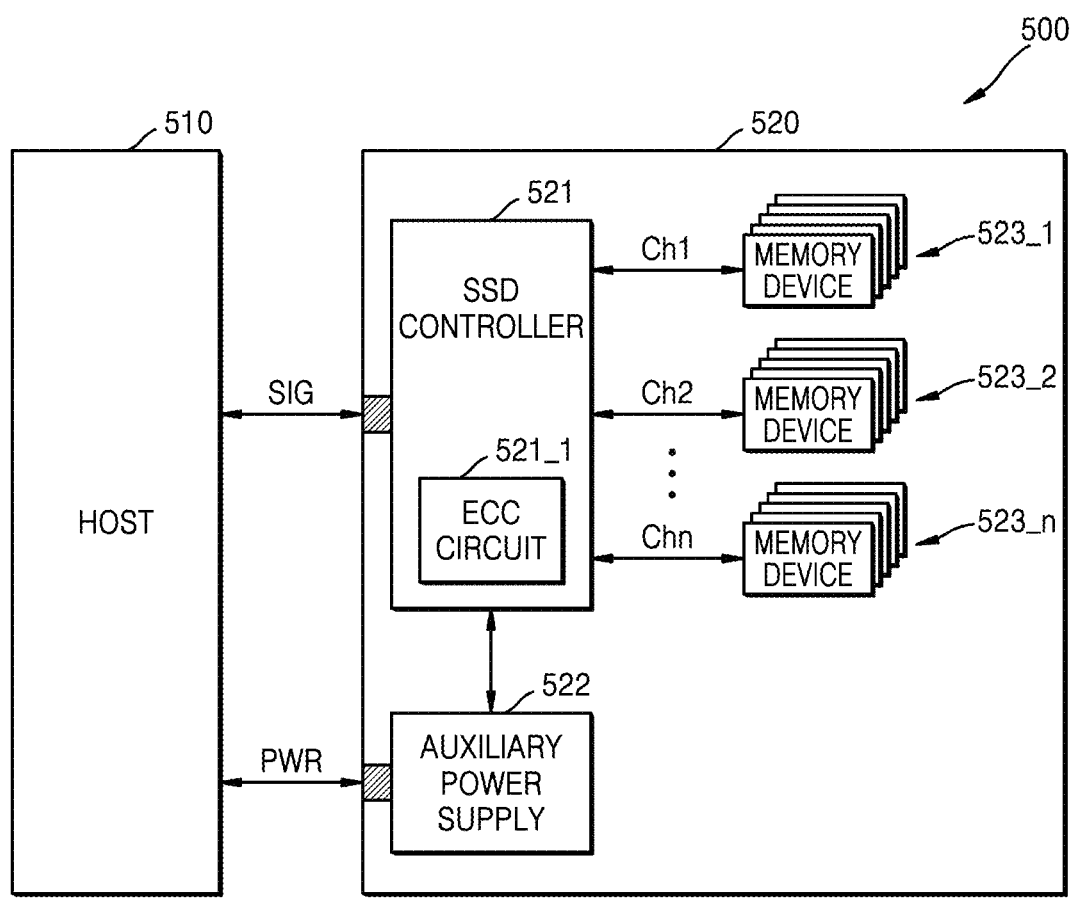
FIG. 20 is a block diagram illustrating an example of a solid state drive (SSD) system using a memory device according to embodiments.

FIG. 20 is a block diagram illustrating an example of a SSD system 500 using a memory device according to some example embodiments.

Referring to FIG. 20, the SSD system 500 may include a host 510 and an SSD 520. The SSD 520 may exchange signals with the host 510 through a signal connector and may receive electric power through a power connector. The SSD 520 may include an SSD controller 521, an auxiliary power supply 522, and memory devices 523_1 through 523_n. The memory devices 523_1 through 523_n may include a vertical stacked NAND flash memory device. At this time, the SSD 520 may be implemented using some example embodiments described above with reference to FIGS. 1 through 19C. In other words, the SSD controller 521 of the SSD 520 may include an ECC circuit 521_1 according to some example embodiments described above and may perform ECC encoding and/or decoding in sub-page units and perform ECC encoding and/or decoding in page units. Each of the memory devices 523_1 through 523_n may perform a program operation in page units and perform a read operation in sub-page units.

Figure 21:
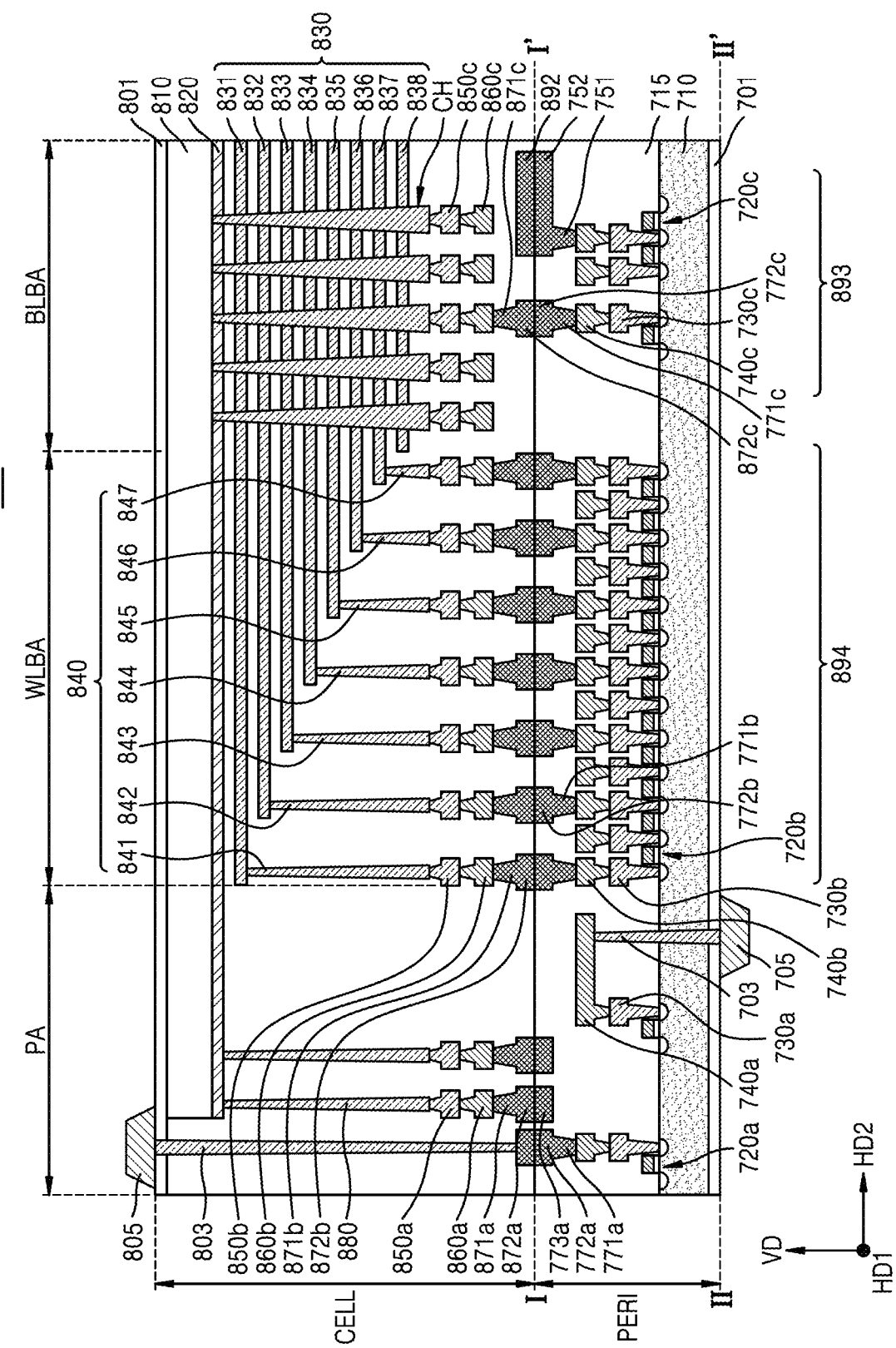
FIG. 21 is a diagram illustrating a memory device according to another example embodiment.

FIG. 21 is a diagram illustrating a memory device 600 according to some example embodiments.

Referring to FIG. 21, a memory device 600 may have a chip-to-chip (C2C) structure. The C2C structure may refer to a structure formed by manufacturing an upper chip on a first wafer, the upper chip including a cell region CELL, manufacturing a lower chip on a second wafer, separate from the first wafer, the lower chip including a peripheral circuit region PERI, and then bonding the upper chip and the lower chip to each other. Here, the bonding process may include a method of electrically connecting a bonding metal formed on an uppermost metal layer of the upper chip to a bonding metal formed on an uppermost metal layer of the lower chip. For example, the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 600 may include an external pad bonding area PA, a word line bonding area WLBA, and a bit line bonding area BLBA.

The peripheral circuit region PERI may include a first substrate 710, an interlayer insulating layer 715, a plurality of circuit elements 720a, 720b, and 720c formed on the first substrate 710, first metal layers 730a, 730b, and 730c respectively connected to the plurality of circuit elements 720a, 720b, and 720c, and second metal layers 740a, 740b, and 740c formed on the first metal layers 730a, 730b, and 730c. In some example embodiments, the first metal layers 730a, 730b, and 730c may be formed of tungsten having relatively high electrical resistivity, and the second metal layers 740a, 740b, and 740c may be formed of copper having relatively low electrical resistivity.

In some example embodiments illustrated in FIG. 21, although only the first metal layers 730a, 730b, and 730c and the second metal layers 740a, 740b, and 740c are shown and described, the example embodiment is not limited thereto, and one or more additional metal layers may be further formed on the second metal layers 740a, 740b, and 740c. At least some of the one or more additional metal layers formed on the second metal layers 740a, 740b, and 740c may be formed of aluminum or the like having a lower electrical resistivity than those of copper forming the second metal layers 740a, 740b, and 740c.

The interlayer insulating layer 715 may be disposed on the first substrate 710 and cover the plurality of circuit elements 720a, 720b, and 720c, the first metal layers 730a, 730b, and 730c, and the second metal layers 740a, 740b, and 740c. The interlayer insulating layer 715 may include an insulating material such as silicon oxide, silicon nitride, or the like.

Lower bonding metals 771b and 772b may be formed on the second metal layer 740b in the word line bonding area WLBA. In the word line bonding area WLBA, the lower bonding metals 771b and 772b in the peripheral circuit region PERI may be electrically bonded to upper bonding metals 871b and 872b in the cell region CELL. The lower bonding metals 771b and 772b and the upper bonding metals 871b and 872b may be formed of aluminum, copper, tungsten, or the like. Further, the upper bonding metals 871b and 872b in the cell region CELL may be referred as first metal pads and the lower bonding metals 771b and 772b in the peripheral circuit region PERI may be referred as second metal pads.

The cell region CELL may include at least one memory block. The cell region CELL may include a second substrate 810 and a common source line 820. On the second substrate 810, a plurality of word lines 831 to 838 (i.e., 830) may be stacked in a direction (a Z-axis direction), perpendicular to an upper surface of the second substrate 810. At least one string select line and at least one ground select line may be arranged on and below the plurality of word lines 830, respectively, and the plurality of word lines 830 may be disposed between the at least one string select line and the at least one ground select line.

In the bit line bonding area BLBA, a channel structure CH may extend in a direction (a Z-axis direction), perpendicular to the upper surface of the second substrate 810, and pass through the plurality of word lines 830, the at least one string select line, and the at least one ground select line. The channel structure CH may include a data storage layer, a channel layer, a buried insulating layer, and the like, and the channel layer may be electrically connected to a first metal layer 850c and a second metal layer 860c. For example, the first metal layer 850c may be a bit line contact, and the second metal layer 860c may be a bit line. In some example embodiments, the bit line (or the second metal layer, 860c) may extend in a first direction (a Y-axis direction), parallel to the upper surface of the second substrate 810.

In some example embodiments illustrated in FIG. 21, an area in which the channel structure CH, the bit line 860c, and the like are disposed may be defined as the bit line bonding area BLBA. In the bit line bonding area BLBA, the bit line 860c may be electrically connected to the circuit elements 720c providing a page buffer 893 in the peripheral circuit region PERI. The bit line 860c may be connected to upper bonding metals 871c and 872c in the cell region CELL, and the upper bonding metals 871c and 872c may be connected to lower bonding metals 771c and 772c connected to the circuit elements 720c of the page buffer 893. In some example embodiments, a program operation may be executed based on a page unit as write data of the page unit is stored in the page buffer 893, and a read operation may be executed based on a sub-page unit as read data of the sub-page unit is stored in the page buffer 893. Also, in the program operation and the read operation, units of data transmitted through bit lines may be different from each other.

In the word line bonding area WLBA, the plurality of word lines 830 may extend in a second direction (an X-axis direction), parallel to the upper surface of the second substrate 810 and perpendicular to the first direction, and may be connected to a plurality of cell contact plugs 841 to 847 (i.e., 840). The plurality of word lines 830 and the plurality of cell contact plugs 840 may be connected to each other in pads provided by at least a portion of the plurality of word lines 830 extending in different lengths in the second direction. A first metal layer 850b and a second metal layer 860b may be connected to an upper portion of the plurality of cell contact plugs 840 connected to the plurality of word lines 830, sequentially. The plurality of cell contact plugs 840 may be connected to the peripheral circuit region PERI by the upper bonding metals 871b and 872b of the cell region CELL and the lower bonding metals 771b and 772b of the peripheral circuit region PERI in the word line bonding area WLBA.

The plurality of cell contact plugs 840 may be electrically connected to the circuit elements 720b forming a row decoder 894 in the peripheral circuit region PERI. In some example embodiments, operating voltages of the circuit elements 720b of the row decoder 894 may be different than operating voltages of the circuit elements 720c forming the page buffer 893. For example, operating voltages of the circuit elements 720c forming the page buffer 893 may be greater than operating voltages of the circuit elements 720b forming the row decoder 894.

A common source line contact plug 880 may be disposed in the external pad bonding area PA. The common source line contact plug 880 may be formed of a conductive material such as a metal, a metal compound, polysilicon, or the like, and may be electrically connected to the common source line 820. A first metal layer 850a and a second metal layer 860a may be stacked on an upper portion of the common source line contact plug 880, sequentially. For example, an area in which the common source line contact plug 880, the first metal layer 850a, and the second metal layer 860a are disposed may be defined as the external pad bonding area PA.

Input-output pads 705 and 805 may be disposed in the external pad bonding area PA. Referring to FIG. 21, a lower insulating film 701 covering a lower surface of the first substrate 710 may be formed below the first substrate 710, and a first input-output pad 705 may be formed on the lower insulating film 701. The first input-output pad 705 may be connected to at least one of the plurality of circuit elements 720a, 720b, and 720c disposed in the peripheral circuit region PERI through a first input-output contact plug 703, and may be separated from the first substrate 710 by the lower insulating film 701. In addition, a side insulating film may be disposed between the first input-output contact plug 703 and the first substrate 710 to electrically separate the first input-output contact plug 703 and the first substrate 710.

Referring to FIG. 21, an upper insulating film 801 covering the upper surface of the second substrate 810 may be formed on the second substrate 810, and a second input-output pad 805 may be disposed on the upper insulating layer 801. The second input-output pad 805 may be connected to at least one of the plurality of circuit elements 720a, 720b, and 720c disposed in the peripheral circuit region PERI through a second input-output contact plug 803. In the example embodiment, the second input-output pad 805 is electrically connected to a circuit element 720a.

According to some example embodiments, the second substrate 810 and the common source line 820 may not be disposed in an area in which the second input-output contact plug 803 is disposed. Also, the second input-output pad 805 may not overlap the word lines 830 in the third direction (the Z-axis direction). Referring to FIG. 21, the second input-output contact plug 303 may be separated from the second substrate 810 in a direction, parallel to the upper surface of the second substrate 810, and may pass through the interlayer insulating layer 815 of the cell region CELL to be connected to the second input-output pad 805.

According to embodiments, the first input-output pad 705 and the second input-output pad 805 may be selectively formed. For example, the memory device 600 may include only the first input-output pad 705 disposed on the first substrate 710 or the second input-output pad 805 disposed on the second substrate 810. Alternatively, the memory device 600 may include both the first input-output pad 705 and the second input-output pad 805.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 600 may include a lower metal pattern 773a, corresponding to an upper metal pattern 872a formed in an uppermost metal layer of the cell region CELL, and having the same cross-sectional shape as the upper metal pattern 872a of the cell region CELL so as to be connected to each other, in an uppermost metal layer of the peripheral circuit region PERI. In the peripheral circuit region PERI, the lower metal pattern 773a formed in the uppermost metal layer of the peripheral circuit region PERI may not be connected to a contact. Similarly, in the external pad bonding area PA, an upper metal pattern 872a, corresponding to the lower metal pattern 773a formed in an uppermost metal layer of the peripheral circuit region PERI, and having the same shape as a lower metal pattern 773a of the peripheral circuit region PERI, may be formed in an uppermost metal layer of the cell region CELL.

The lower bonding metals 771b and 772b may be formed on the second metal layer 740b in the word line bonding area WLBA. In the word line bonding area WLBA, the lower bonding metals 771b and 772b of the peripheral circuit region PERI may be electrically connected to the upper bonding metals 871b and 872b of the cell region CELL by a Cu-to-Cu bonding.

Further, in the bit line bonding area BLBA, an upper metal pattern 892, corresponding to a lower metal pattern 752 formed in the uppermost metal layer of the peripheral circuit region PERI, and having the same cross-sectional shape as the lower metal pattern 752 of the peripheral circuit region PERI, may be formed in an uppermost metal layer of the cell region CELL. A contact may not be formed on the upper metal pattern 892 formed in the uppermost metal layer of the cell region CELL.

In some example embodiments, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

Any or all of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments have been particularly shown and described with reference to embodiments thereof, it will be understood that various changes in form and details may be made therein without departing from the spirit and scope of the following claims.

What is claimed is:

1. A memory device comprising:
    a cell array including a plurality of pages; and
    a control logic circuitry configured to control program operations of the cell array and read operations of the cell array,
    wherein the control logic circuitry is configured to control the program operations and read operations such that
    (A) in response to a program command for a page, the memory device stores first through N-th codewords in a first page among the plurality of pages and the memory device programs a page parity corresponding in common to the first through N-th codewords to the first page, and
    (B) in response to a read command for a sub-page, the memory device selectively reads the first codeword among the first through N-th codewords, where N is an integer of at least 2, wherein a size of the sub-page is less than a size of the page.
    wherein the first codeword includes first sub-page data and a first sub-parity corresponding to the first sub-page data, and the first sub-parity includes information associated with correcting an error in the first sub-page data through error correction code (ECC) decoding, the ECC decoding independently performable on each of the first through N-th codewords,
    wherein the memory device is configured to program the first through N-th codewords to the first page in a single program operation in response to a plurality of write requests from a host; and
    wherein the memory device is configured to provide the first codeword to the host in a single read operation in response to a single read request from the host.

2. The memory device of claim 1, wherein the memory device is configured to read the first codeword and to output the first codeword to a memory controller circuitry and,
    in response to the error in the first sub-page data not corrected, the memory device is configured to further read the second through N-th codewords and the page parity and to output the second through N-th codewords and the page parity to the memory controller circuitry.

3. The memory device of claim 1, further comprising:
    a page buffer configured to store the first through N-th codewords and the page parity of the first through N-th codewords, and to provide the first through N-th codewords and the page parity to the cell array in response to the program command from a memory controller circuitry, the program command associated with the page.

4. The memory device of claim 3, wherein the page buffer is configured to store the first codeword, the first codeword being read in response to the read command associated with the sub-page; and
    the memory device is configured to output the first codeword to the memory controller circuitry that is stored in the page buffer as the sub-page.

5. The memory device of claim 1, wherein each memory cell of the cell array is configured to store M bits, where M is an integer of at least 2;
    a plurality of memory cells connected to a word line correspond to the first page and second through M-th pages; and
    the cell array is configured to store the first through N-th codewords and the page parity in one of the first through M-th pages.

6. The memory device of claim 1, wherein each memory cell of the cell array is configured to store M bits, where M is an integer of at least 2;
    a plurality of memory cells connected to a word line correspond to the first page and second through M-th pages;
    the page parity further corresponds to (N+1)-th through K-th codewords, where K is an integer greater than N; and
    the memory cell array is configured to store the (N+1)-th through K-th codewords in the second through M-th pages in a distributed fashion.

7. The memory device of claim 1, wherein the page parity includes information based on low density parity-check code (LDPC), the LDPC information in relation to the first through N-th codewords.

8. The memory device of claim 1, wherein the page parity includes information generated using first through N-th extra parities, the first through N-th extra parities calculated by a certain operation on each of the first through N-th codewords before the page parity is generated, and
    the first through N-th extra parities are not stored in the cell array before or after the generation of the information in the page parity.

9. A memory system comprising:
a memory device including a cell array including a plurality of pages; and
a memory controller circuitry including a memory interface circuitry configured to communicate with the memory device, and an error correction code (ECC) circuitry configured to generate a codeword including a sub-parity by performing first ECC encoding on sub-page data and to generate a page parity by performing second ECC encoding on first through N-th codewords generated through the first ECC encoding, wherein in response to a write request from a host the memory controller circuitry is configured to transmit a program command associated with a page to the memory device and to program the first through N-th codewords and the page parity to a first page of the cell array, and in response to a read request from the host, the memory controller circuitry is configured to transmit a read command associated with a sub-page to the memory device and to selectively read the first codeword, where N is an integer of at least 2, wherein a size of the sub-page is less than a size of the page,
wherein the memory device is configured to program the first through N-th codewords to the first page in a single program operation in response to a plurality of write requests from the host; and
wherein the memory device is configured to provide the first codeword to the host in the single read operation in response to a single read request from the host.

10. The memory system of claim 9, wherein the memory controller circuitry is configured to receive, from the host, the write request corresponding to a size that is less than or equal to the sub-page; and
the first through N-th codewords include a plurality of pieces of write data respectively corresponding to a plurality of write requests from the host.

11. The memory system of claim 9, wherein the first codeword includes first sub-page data and a first sub-parity corresponding to the first sub-page data, and the error correction circuitry is configured to perform the error correction on the first sub-page data through ECC decoding independently performed on each codeword.

12. The memory system of claim 11, wherein, in response to an error in the first sub-page data not being corrected, the memory controller circuitry is further configured to read the second through N-th codewords and the page parity and to correct the error in the first sub-page data using the second through N-th codewords and the page parity.

13. The memory system of claim 11, wherein the memory controller circuitry is further configured to calculate first through N-th extra parities by performing a certain operation on each of the first through N-th codewords and to generate the page parity using the first through N-th extra parities; and
the first through N-th extra parities are not stored in the memory device.

14. The memory system of claim 13, wherein, in response to an error occurring in the first sub-page data, the memory controller circuitry is further configured to read the second through N-th codewords, to calculate the second through N-th extra parities, to calculate the first extra parity based on the second through N-th extra parities and the page parity, and to correct the error in the first sub-page data using the first extra parity.

15. The memory system of claim 9, wherein the memory controller circuitry further includes a page parity generator circuitry configured to generate the page parity based on the first through N-th codewords,
the memory device includes a plurality of NAND flash memories, the memory controller circuitry is connected to the plurality of NAND flash memories through a plurality of channels, and
the page parity generator circuitry is shared by the plurality of NAND flash memories.

16. An operating method of a memory system, the operating method comprising:
receiving, from a host, a plurality of write requests and a plurality of pieces of write data respectively corresponding to the plurality of write requests;
generating a codeword by performing first error correction code (ECC) encoding in units of sub-pages, the sub-pages including at least one piece of write data;
generating a page parity by performing ECC encoding based on first through N-th codewords generated through the first ECC encoding, where N is an integer of at least 2, wherein a size of the sub-page is less than a size of the page;
programming the first through N-th codewords and the page parity to a first page of a memory device in a program operation, the program operation performed in pages; and
selectively reading the first codeword from the first page in response to a read request of the host,
wherein the first codeword includes first sub-page data and a first sub-parity corresponding to the first sub-page data, and error correction is performed on the first sub-page data through ECC decoding, the ECC decoding independently performed on each codeword,
wherein the memory device is configured to program the first through N-th codewords to the first page in a single program operation in response to a plurality of write requests from a host; and
wherein the memory device is configured to provide the first codeword to the host in a single read operation in response to single read request from the host.

17. The operating method of claim 16, wherein the program operation is performed in pages including the plurality of pieces of write data respectively corresponding to the plurality of write requests of the host, and
the first sub-page data is output to the host in response to a read request of the host.

18. The operating method of claim 17, wherein the memory system includes a memory controller circuitry and a memory device,
a page of data including the first through N-th codewords and the page parity is read and stored in a page buffer of the memory device in response to the read request of the host, and
the first codeword among the first through N-th codewords stored in the page buffer is selectively output to the memory controller circuitry.

19. The operating method of claim 18, further comprising:
outputting the second through N-th codewords and the page parity from the page buffer to the memory controller circuitry when an error in the first sub-page data is not corrected; and
correcting the error in the first sub-page data using the page parity and at least some of the second through N-th codewords.

* * * * *